United States Patent
Hyun et al.

(10) Patent No.: US 11,450,610 B2
(45) Date of Patent: Sep. 20, 2022

(54) VERTICAL SEMICONDUCTOR DEVICES

(71) Applicant: Samsung Electronics Co., Ltd., Suwon-si (KR)

(72) Inventors: Seung Hyun, Suwon-si (KR); Dongug Ko, Suwon-si (KR); Joohee Park, Suwon-si (KR); Juhak Song, Hwaseong-si (KR); Jongseon Ahn, Seongnam-si (KR); Sungwon Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 190 days.

(21) Appl. No.: 16/876,600

(22) Filed: May 18, 2020

(65) Prior Publication Data
US 2021/0043568 A1 Feb. 11, 2021

(30) Foreign Application Priority Data
Aug. 7, 2019 (KR) .................. 10-2019-0095885

(51) Int. Cl.
*H01L 23/535* (2006.01)
*H01L 27/11556* (2017.01)
(Continued)

(52) U.S. Cl.
CPC ...... *H01L 23/535* (2013.01); *H01L 21/76805* (2013.01); *H01L 21/76816* (2013.01);
(Continued)

(58) Field of Classification Search
CPC ............ H01L 23/535; H01L 21/76805; H01L 21/76816; H01L 21/76877;
(Continued)

(56) References Cited

U.S. PATENT DOCUMENTS 8,563,378 B2    10/2013  Shim et al.
9,202,780 B2    12/2015  Lee et al.
(Continued)

FOREIGN PATENT DOCUMENTS

KR      100512051 B1    8/2005
KR      20100074634 A   7/2010
(Continued)

OTHER PUBLICATIONS

German Office Action dated Sep. 16, 2021, issued in corresponding German Patent Application No. 10 2020 110 938.5.

*Primary Examiner* — Shahed Ahmed
*Assistant Examiner* — Vicki B. Booker
(74) *Attorney, Agent, or Firm* — Harness, Dickey & Pierce, P.L.C.

(57) ABSTRACT

A vertical semiconductor device may include may include a substrate, a stacked structure, an insulating interlayer, a buffer pattern and a first contact plug. The stacked structure may include insulation patterns and conductive patterns stacked on each other on the substrate. The conductive patterns may extend in a first direction parallel to an upper surface of the substrate, and edges of the conductive patterns may have a staircase shape. The conductive patterns may include pad patterns defined by exposed upper surfaces of the conductive patterns. The insulating interlayer may cover the stacked structure. The buffer pattern may be on the insulating interlayer. The first contact plug may pass through the buffer pattern and the insulating interlayer. The first
(Continued)

contact plug may contact one of the pad patterns. The buffer pattern may reduce defects from forming the first contact plug.

20 Claims, 32 Drawing Sheets

(51) Int. Cl.
    *H01L 27/11582*     (2017.01)
    *H01L 23/522*     (2006.01)
    *H01L 21/768*     (2006.01)
    *H01L 23/528*     (2006.01)

(52) U.S. Cl.
    CPC .. *H01L 21/76877* (2013.01); *H01L 21/76895* (2013.01); *H01L 23/5226* (2013.01); *H01L 23/5283* (2013.01); *H01L 27/11556* (2013.01); *H01L 27/11582* (2013.01)

(58) Field of Classification Search
    CPC ........... H01L 21/76895; H01L 23/5226; H01L 23/5283; H01L 27/11556; H01L 27/11582
    See application file for complete search history.

(56) References Cited

U.S. PATENT DOCUMENTS

| | | |
|---|---|---|
| 9,865,540 B2 | 1/2018 | Kim et al. |
| 10,014,313 B1 | 7/2018 | Lee |
| 2012/0043666 A1 | 2/2012 | Park et al. |
| 2012/0077320 A1 | 3/2012 | Shim et al. |
| 2012/0153500 A1 | 6/2012 | Kim et al. |
| 2012/0187471 A1* | 7/2012 | Yu ..................... H01L 27/11565 257/324 |
| 2014/0197546 A1* | 7/2014 | Hwang ............. H01L 27/11548 257/774 |
| 2018/0027758 A1 | 2/2018 | Rossouw et al. |
| 2018/0107905 A1 | 4/2018 | Davies et al. |
| 2018/0277558 A1 | 9/2018 | Lee |
| 2019/0326166 A1* | 10/2019 | Nam .................. H01L 23/5283 |

FOREIGN PATENT DOCUMENTS

| | | |
|---|---|---|
| KR | 20170046892 A | 5/2017 |
| KR | 20180107905 A | 10/2018 |

* cited by examiner

VERTICAL SEMICONDUCTOR DEVICES

CROSS-REFERENCE TO RELATED APPLICATION

This application claims priority under 35 USC § 119 to Korean Patent Application No. 10-2019-0095885, filed on Aug. 7, 2019, in the Korean Intellectual Property Office (KIPO), the contents of which are incorporated by reference herein in their entirety.

BACKGROUND

1. Field

Example embodiments relate to vertical semiconductor devices. More particularly, example embodiments relate to vertical NAND flash memory devices.

2. Description of Related Art

Recently, vertical memory devices in which memory cells may be stacked vertically from a surface of a substrate have been developed. An edge of stacked conductive lines included in the memory cells may have a staircase shape, and an edge upper surface of the stacked conductive lines may serve as pad patterns. Contact plugs may be formed on the pad patterns, respectively.

SUMMARY

Example embodiments provide a vertical semiconductor device in which defects of contact plugs may be reduced.

Example embodiments provide a method of manufacturing a vertical semiconductor device in which defects of contact plugs may be reduced.

According to example embodiments, there is provided a vertical semiconductor device that may include a substrate, a stacked structure, an insulating interlayer, a buffer pattern, and a first contact plug. The stacked structure may include insulation patterns and conductive patterns repeatedly stacked on each other on the substrate. The conductive patterns may extend in a first direction parallel to an upper surface of the substrate, and edges of the conductive patterns may have a staircase shape. The conductive patterns may include pad patterns that may be defined by exposed portions of upper surfaces of the conductive patterns. The insulating interlayer may cover the stacked structure. The buffer pattern may be formed on the insulating interlayer. The first contact plug may pass through the buffer pattern and the insulating interlayer. The first contact plug may contact one of the pad patterns.

According to example embodiments, there is provided a vertical semiconductor device that may include a substrate, a stacked structure, a channel structure, an insulating interlayer, a buffer pattern, a first contact plug, a second contact plug, and upper wirings. The stacked structure may include insulation patterns and conductive patterns stacked on each other on the substrate. The conductive patterns may extend in a first direction parallel to an upper surface of the substrate. Edges of the conductive patterns may have a staircase shape. The conductive patterns may include pad patterns that may be defined by exposed portions of upper surfaces of the conductive patterns. The channel structure may pass through the stacked structure, and may extend in a vertical direction. The insulating interlayer may cover the stacked structure. The buffer pattern may be on the insulating interlayer and may face at least one of pad patterns. A first contact plug may pass through the buffer pattern and the insulating interlayer. The first contact plug may contact one of the pad patterns. A second contact plug may pass through only the insulating interlayer. The second contact plug may contact one of the pad patterns. The upper wirings may be electrically connected to the first contact plug and the second contact plug, respectively.

According to example embodiments, there is provided a vertical semiconductor device that may include a substrate, a stacked structure, an insulating interlayer, a buffer pattern and contact plugs. The stacked structure may include insulation patterns and conductive patterns stacked on each other on the substrate. The conductive patterns may extend in a first direction parallel to an upper surface of the substrate. Edges of the conductive patterns may have a staircase shape. The conductive patterns may include pad patterns that may be defined by exposed portions of upper surfaces of the conductive patterns. The insulating interlayer may cover the stacked structure. The buffer pattern may be on the insulating interlayer. The buffer pattern may include a material having an etch selectivity with respect to the insulating interlayer. Contact plugs may pass through the insulating interlayer. The contact plugs may contact upper surfaces of the pad patterns, respectively. At least one of the contact plugs may pass through the buffer pattern.

According to example embodiments, there is provided a method of manufacturing a vertical semiconductor device. In the method, a stacked structure including insulation patterns and conductive patterns stacked on each other may be formed on a substrate. The conductive patterns may extend in a first direction parallel to an upper surface of the substrate, and edges of the conductive patterns may have a staircase shape. The conductive patterns may include pad patterns that may be defined by exposed portions of upper surfaces of the conductive patterns. Exposed upper surfaces of the conductive patterns may serve as pad patterns. An insulating interlayer may be formed to cover the stacked structure. A buffer pattern may be formed on the insulating interlayer. A portion of the buffer pattern and the insulating interlayer may be etched to form a first contact hole exposing one of the pad patterns. A first contact plug may be formed to fill the first contact hole.

In a vertical semiconductor device in accordance with example embodiments, the buffer pattern may be formed on the pad structure. Further, at least one of contact plugs may pass through the buffer pattern. Thus, defects of the contact plug such as a punching or a contact not open may be reduced by the buffer pattern.

BRIEF DESCRIPTION OF THE DRAWINGS

Example embodiments will be more clearly understood from the following detailed description taken in conjunction with the accompanying drawings.

FIG. 1 is a cross-sectional view illustrating a vertical semiconductor device in accordance with example embodiments;

FIG. 2 is a perspective view illustrating a portion of a pad structure in the vertical semiconductor device:

FIG. 3 is a plan view illustrating a portion of a pad structure in the vertical semiconductor device;

FIGS. 4 to 12 are cross-sectional views illustrating a method of manufacturing a vertical semiconductor device in accordance with example embodiments;

FIG. 13 is a cross-sectional view illustrating a vertical semiconductor device in accordance with example embodiments;

FIGS. 14 and 15 are cross-sectional views illustrating a method of manufacturing a vertical semiconductor device in accordance with example embodiments;

FIG. 16 is a cross-sectional view illustrating a vertical semiconductor device in accordance with example embodiments;

FIGS. 17 and 18 are cross-sectional views illustrating a method of manufacturing a vertical semiconductor device in accordance with example embodiments;

FIG. 19 is a cross-sectional view illustrating a vertical semiconductor device in accordance with example embodiments;

FIG. 20 is a cross-sectional view illustrating a vertical semiconductor device in accordance with example embodiments;

FIGS. 21 to 23 are cross-sectional views illustrating a method of manufacturing a vertical semiconductor device in accordance with example embodiments;

FIG. 24 is a cross-sectional view illustrating a vertical semiconductor device in accordance with example embodiments;

FIG. 25 is a cross-sectional view illustrating a vertical semiconductor device in accordance with example embodiments;

FIG. 26 is a cross-sectional view illustrating a vertical semiconductor device in accordance with example embodiments;

FIG. 27 is a plan view illustrating a vertical semiconductor device in accordance with example embodiments;

FIG. 28 is a plan view illustrating a vertical semiconductor device in accordance with example embodiments;

FIGS. 29 and 30 are cross-sectional views illustrating a method of manufacturing a vertical semiconductor device in accordance with example embodiments;

FIG. 31 is a cross-sectional view illustrating a vertical semiconductor device in accordance with example embodiments; and FIGS. 32 and 33 are cross-sectional views illustrating a method of manufacturing a vertical semiconductor device in accordance with example embodiments.

DESCRIPTION OF EMBODIMENTS

Hereinafter, a direction substantially parallel to an upper surface of a substrate is defined as a first direction. A direction substantially parallel to the upper surface of the substrate and perpendicular to the first direction is defined as a second direction. A direction substantially perpendicular to the upper surface of the substrate is defined as a vertical direction and also may be referred to as a third direction.

Figure 1:
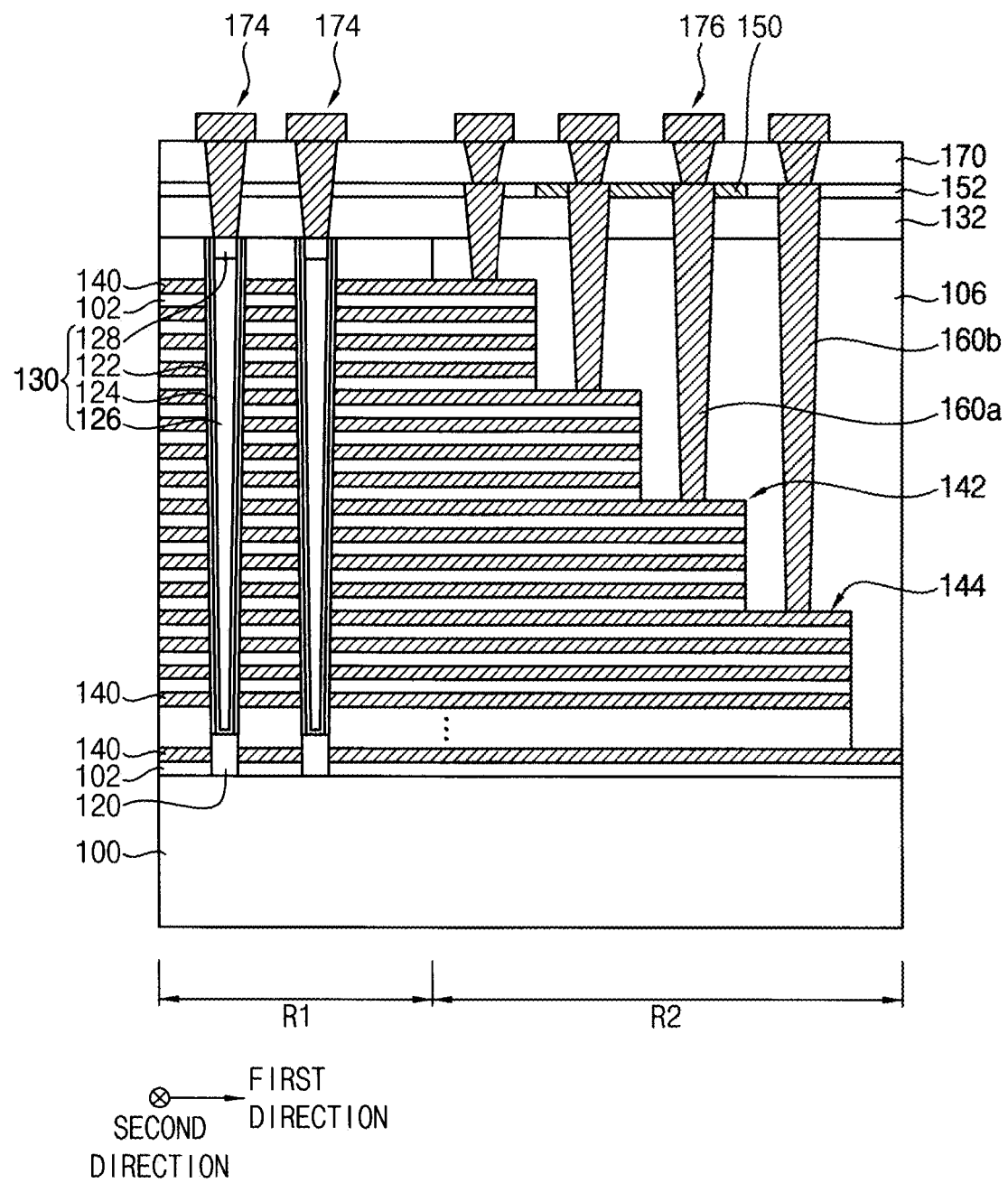
FIGS. 1 to 33 represent non-limiting, example embodiments as described herein.
Figure 2:
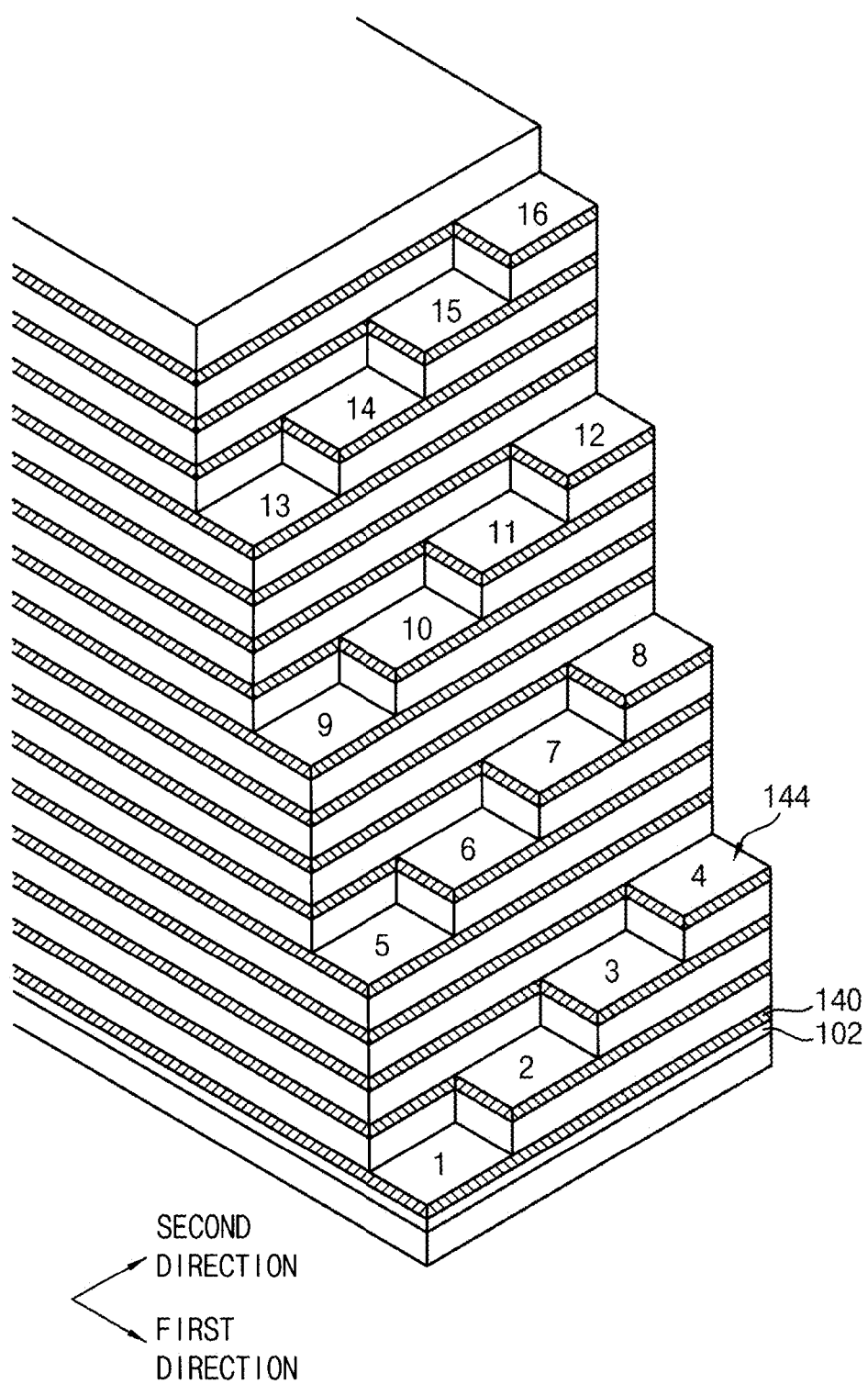
Figure 3:
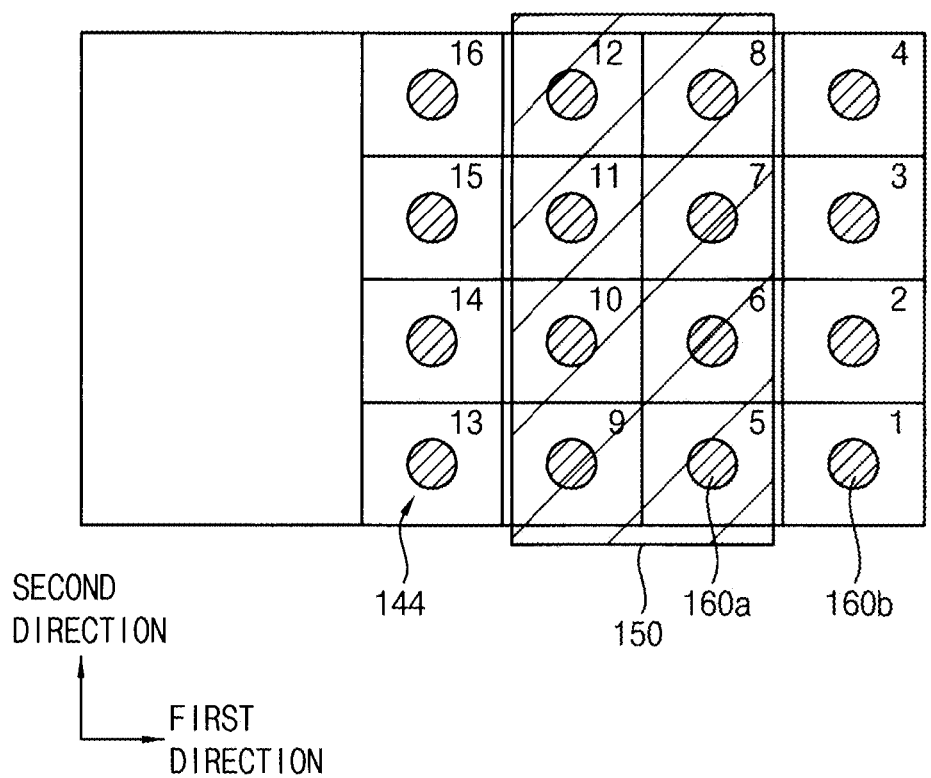

FIG. 1 is a cross-sectional view illustrating a vertical semiconductor device in accordance with example embodiments. FIG. 2 is a perspective view illustrating a portion of a pad structure in the vertical semiconductor device. FIG. 3 is a plan view illustrating a portion of a pad structure in the vertical semiconductor device.

Referring to FIGS. 1 and 2, a substrate 100 may have a first region R1 and a second region R2. The first region R1 may be a cell region in which memory cells may be formed, and the second region R2 may be a wiring region in which wirings connecting the may be cells may be formed. In example embodiments, the second region R2 may be portions adjacent to both sidewalls of edges of the first region R1 in the first direction.

The substrate 100 may include a semiconductor material, e.g., silicon or germanium, or a semiconductor on insulator (e.g., silicon or germanium on oxide).

A stacked structure including insulation patterns 102 and conductive patterns 140 may be stacked on each other on the substrate. The insulation patterns and conductive patterns 140 may be alternately and repeatedly stacked on the substrate 100. The conductive patterns 140 may be spaced apart from each other in the vertical direction perpendicular to an upper surface of the substrate 100.

The stacked structure may extend in the first direction substantially parallel to the upper surface of the substrate 100. In example embodiments, a plurality of the stacked structures may be spaced apart from each other in the second direction substantially perpendicular to the first direction.

The stacked structure may be disposed on the substrate 100 of the first and second regions R1 and R2. The stacked structure formed on the substrate 100 of the first region R1 may serve as a conductive pattern structure, and the stacked structure formed on the substrate 100 in the second region R2 may serve as the pad structure 142. The pad structure 142 may contact both sidewalls of the conductive pattern structure in the first direction. The pad structure 142 may be a structure for forming wiring for applying an electrical signal to the conductive pattern structure.

The conductive pattern structure and a channel structure 130 passing through the conductive pattern structure may be formed on the substrate 100 of the first region. The conductive pattern structure and the channel structure 130 may serve as memory cells.

The conductive pattern 140 included in the conductive pattern structure may include a ground selection line (GSL), a string selection line (SSL) and word lines between the ground selection line and the string selection lines.

The conductive pattern 140 may include a metal material. In example embodiments, although not shown, the conductive pattern 140 may include a barrier metal pattern and a metal pattern. The metal pattern may include, e.g., tungsten, copper, cobalt, aluminum, or the like, and the barrier metal pattern may include, e.g., titanium, titanium nitride, tantalum, tantalum nitride, or the like.

The channel structure 130 may have a pillar shape passing through the conductive pattern structure.

In example embodiments, the semiconductor pattern 120 may be further formed between the substrate 100 and the channel structure 130. In this case, the channel structure 130 may be formed on the semiconductor pattern 120. In some example embodiments, the channel structure 130 may directly contact the substrate 100.

In example embodiments, the channel structure 130 may include a dielectric layer structure 122, a channel 124, a filling insulation pattern 126 and an upper conductive pattern 128.

The dielectric layer structure 122 may include a tunnel insulation layer, a charge storage layer and a blocking layer sequentially stacked from an outer wall of the channel 124. The upper conductive pattern 128 may include polysilicon.

In example embodiments, the semiconductor pattern 120 may include, e.g., single crystal silicon or polysilicon.

An edge portion of the pad structure 142 in the first direction may have a staircase shape. The conductive patterns 140 included in the pad structure 142 may have different lengths in a first direction for each of layers. Thus, an upper surface of each of the layers may be exposed at edge portions of the conductive patterns 140 in the first direction. That is, each of the conductive patterns 140 may include an extension portion and an exposed portion, and the exposed portion of the conductive pattern may serve as a pad pattern 144. Heights of upper surfaces of the pad patterns 144 from the substrate 100 may be different to each other.

In example embodiments, the pad structure 142 may have a plurality of staircases in each of the first direction and the second direction. For example, one staircase in the first direction may include a plurality of stacked conductive patterns 140, and the plurality of stacked conductive patterns 140a may be exposed by a vertical sidewall of the one staircase in the first direction. Further, the staircase may be formed in the second direction.

For example, as shown in FIG. 2, in the pad structure 142, the vertical sidewall of the one staircase in the first direction may include four stacked conductive patterns 140. Further, in the pad structure 142, the number of steps of the staircase formed in the second direction may be four. Therefore, the number of the pad patterns 144 serving as the exposed portion of the conductive pattern 140 may be sixteen, but is not limited thereto.

In some example embodiments, the pad structure may have a staircase only in the first direction. In this case, a vertical sidewall of one step in the first direction may include one conductive pattern.

A first insulating interlayer 106 may be formed to cover the pad structure 142. An upper surface of the first insulating interlayer 106 may be flat. In example embodiments, upper surfaces of the first insulating interlayer 106 and the conductive pattern structure may be coplanar with each other.

A second insulating interlayer 132 may be formed on the first insulating interlayer 106, the channel structure 130 and the conductive pattern structure. The first and second insulating interlayers 106 and 132 may include silicon oxide.

A buffer pattern 150 may be formed on at least a portion of the second insulating interlayer 132 in the second region R2.

The buffer pattern 150 may include a material having a high etching selectivity with respect to the first insulating interlayer. That is, the buffer pattern 150 may include a material having an etching rate lower than an etching rate of the silicon oxide, in a process of etching silicon oxide.

In example embodiments, the buffer pattern 150 may include an insulation material. For example, the buffer pattern 150 may include silicon nitride or aluminum oxide.

In example embodiments, the buffer pattern 150 may be disposed to face at least some of the pad patterns 144. The buffer pattern 150 may be disposed to face a portion where over etching defects may occur during forming contact holes exposing the pad pattern 144. For example, the buffer pattern 150 may be one pattern that is not divided.

In example embodiments, the buffer pattern 150 may have a uniform thickness for each position.

In example embodiments, the buffer pattern 150 may be disposed to face the pad patterns 144 positioned at steps between top and bottom steps in the first direction. In this case, the buffer pattern 150 may not be disposed to face the pad patterns 144 positioned at an uppermost step in the first direction and the pad patterns 144 positioned on a lowermost step in the first direction. That is, the buffer pattern 150 may not be formed on the pad patterns 144 positioned on the uppermost step in the first direction and the pad patterns 144 positioned on the lowermost step in the first direction.

In some example embodiments, the buffer pattern 150 may be disposed to face the pad patterns 144 positioned at the steps above the lowermost step in the first direction. In this case, the buffer pattern may not be formed on the pad patterns 144 positioned at the lowermost step in the first direction.

In example embodiments, a third insulating interlayer 152 may be formed on the second insulating interlayer 132 to surround sidewalls of the buffer pattern 150. In example embodiments, upper surfaces of the third insulating interlayer 152 and the buffer pattern 150 may be coplanar with each other.

Contact plugs 160a and 160b may contact on the pad pattern 144. In example embodiments, each of the contact plugs 160a and 160b may include a barrier metal pattern and a metal pattern. At least one of contact plugs 160a may pass through the buffer pattern 150.

The contact plugs may include a first contact plug 160a and a second contact plug 160b. The first contact plug 160a may contact the upper surface of the pad pattern 144 through the buffer pattern 150, the second insulating interlayer 132 and the first insulating interlayer 106. The second contact plug 160b may contact the upper surface of the pad pattern 144 through the third insulating interlayer 152, the second insulating interlayer 132, and the first insulating interlayer 106. That is, the second contact plug 160b may pass through only the insulating interlayers 152, 132 and 106 without passing through the buffer pattern 150.

In example embodiments, the buffer pattern 150 may be formed to be faced the pad patterns 144 positioned between an uppermost step and a lowermost step, in portions for forming the first and second contact plugs 160a and 160b.

In example embodiments, a plurality of first contact plugs 160a may pass through one of the buffer pattern 150.

In example embodiments, the buffer pattern 150 may contact a top sidewall of the first contact plug 160a. Thus, upper surfaces of the buffer pattern 150 and the first contact plug 160a may be substantially coplanar with each other.

For example, when 16 pad patterns 144 are arranged as shown in FIGS. 2 and 3, the buffer pattern 150 is formed over the pad patterns (5 to 12, referred to FIG. 2) disposed at a second-step and a third-step of the staircase in the first direction. Further, the buffer pattern 150 may not be formed over the pad patterns (1 to 4 and 13 to 16, referred to FIG. 2) disposed at a first-step and a fourth-step of the staircase in the first direction.

A fourth insulating interlayer 170 may be formed on the third insulating interlayer 152. A bit line contact may be formed through the second to fourth insulating interlayers 132, 152, and 170, and the bit line contact may be electrically connected to the upper conductive pattern 128 of the channel structure 130. A bit line may be formed on the fourth insulating interlayer 170 and the bit line contact. The bit line contacts and bit lines may serve as a bit line structure 174.

An upper wiring 176 may be formed on the fourth insulating interlayer. The upper wiring 176 may be electrically connected to the first and second contact plugs 160a and 160b passing through the fourth insulating interlayer 170. The upper wiring 176 may include an upper contact plug and a conductive line.

FIGS. 4 to 12 are cross-sectional views illustrating a method of manufacturing a vertical semiconductor device in accordance with example embodiments.

Figure 4:
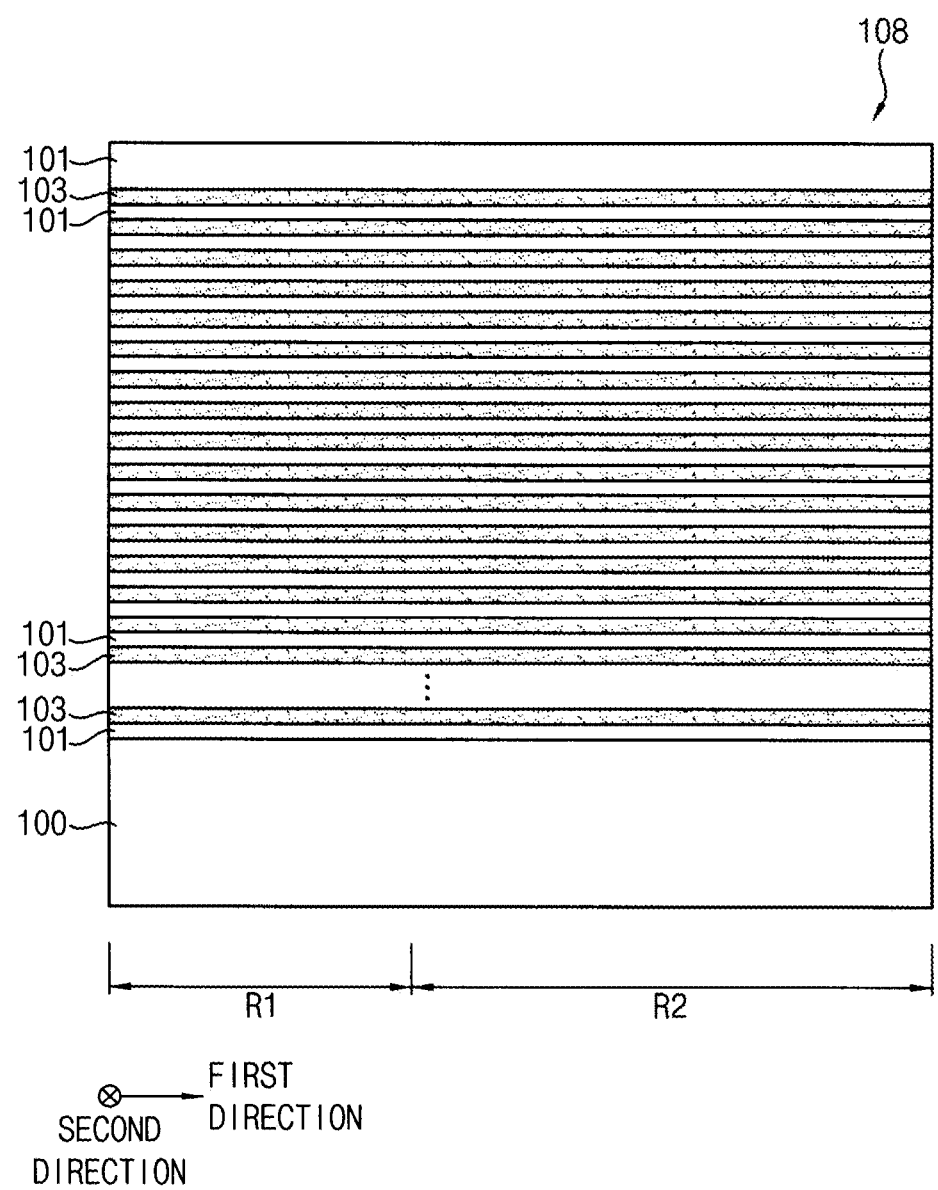

Referring to FIG. 4, the preliminary mold structure 108 may be formed on the substrate 100 of the first and second regions R1 and R2.

Particularly, insulation layers 101 and sacrificial layers 103 may be alternately and repeatedly formed on the substrate 100 to form a preliminary mold structure 108. For example, the insulation layers 101 may include silicon oxide. For example, the sacrificial layers 103 may include a nitride-based material, e.g., silicon nitride (SiN) or silicon boronitride (SiBN).

Figure 5:
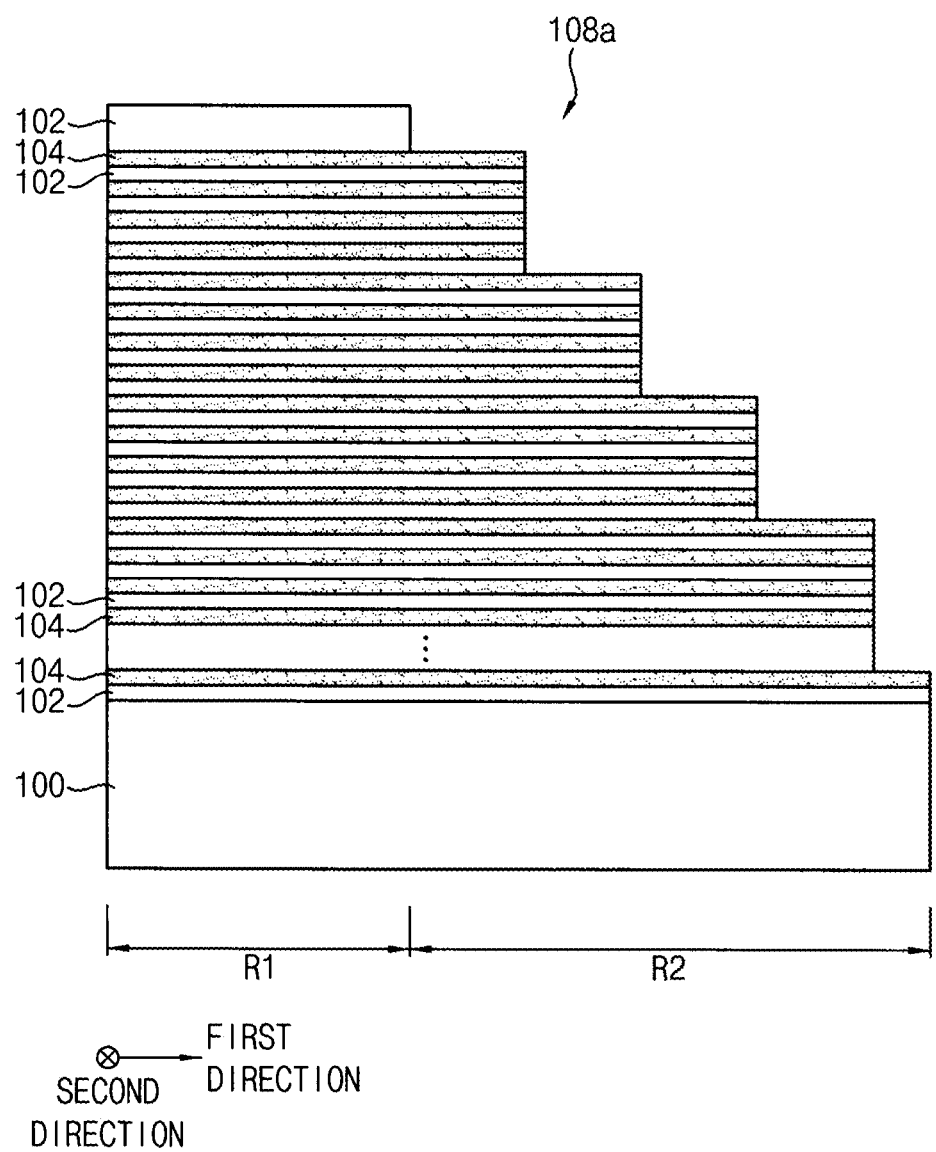

Referring to FIG. 5, edge portions of the preliminary mold structure 108 formed on the substrate 100 of the second region R2 may be etched step by step. Therefore, a step mold structure 108a including insulation patterns 102 and sacrificial layer patterns 104 stacked may be formed on the substrate 100 in the second region R2. The step mold structure 108a may have a staircase shape in the second region.

An upper surface of the sacrificial layer pattern 104 may be exposed at each staircase portion of the step mold structure 108a.

Figure 6:
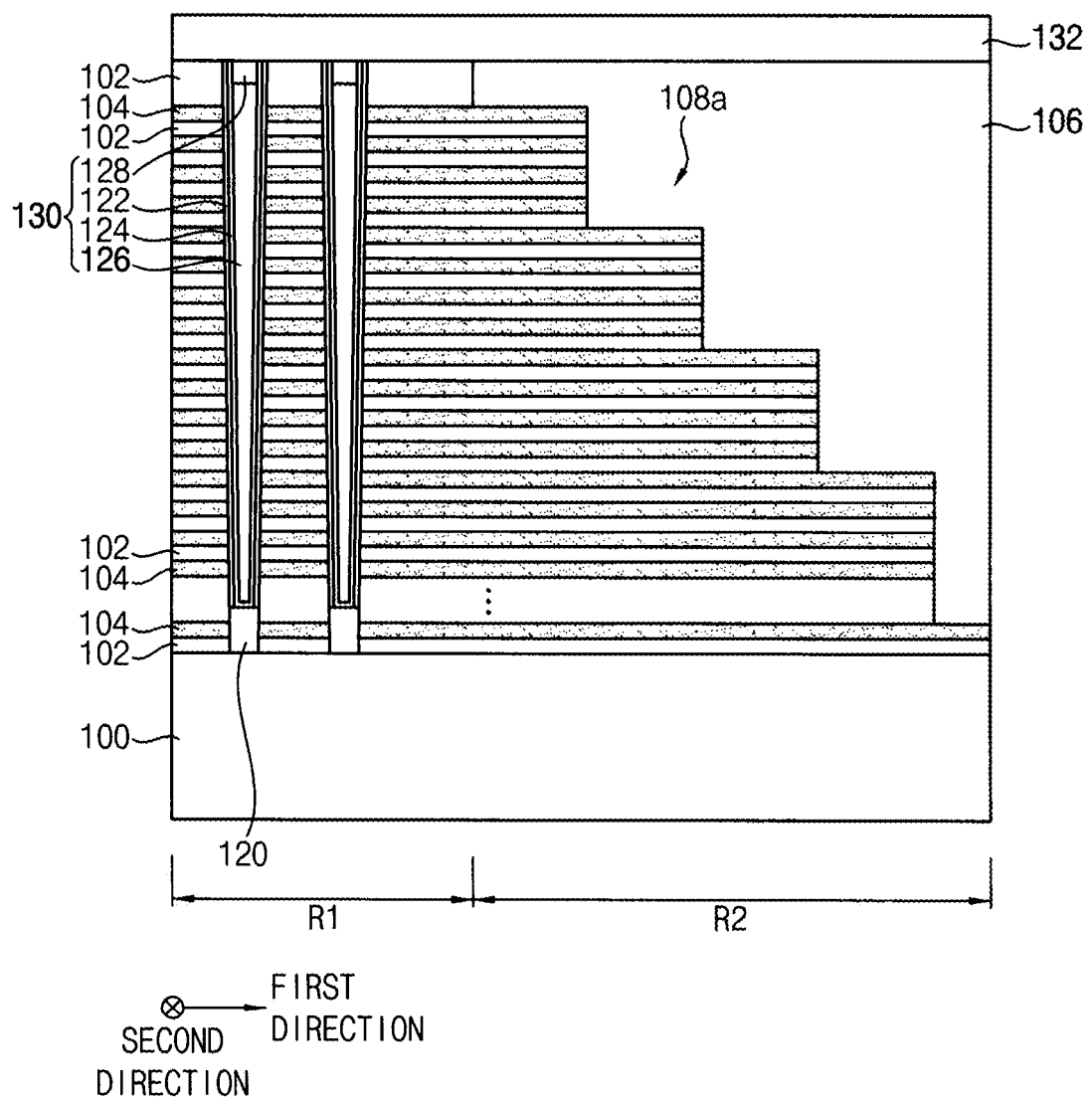

Referring to FIG. 6, a first insulating interlayer 106 may be formed to cover the step mold structure 108a. An upper surface of the first insulating interlayer 106 may be planarized by a planarization process. The planarization process may include a chemical mechanical polishing and/or etch back process.

The step mold structure 108a in the first region R1 may be anisotropically etched to form channel holes. The channel holes may pass through the step mold structure 108a, and the channel hole may expose the surface of the substrate 100 of the first region R1. Channel structures 130 may be formed in the channel holes, respectively. In example embodiments, a semiconductor pattern 120 may be further formed under the channel structure, and the semiconductor pattern 120 may contact the substrate 100.

A second insulating interlayer 132 may be formed on the step mold structure 108a, the channel structure 130 and the first insulating interlayer 106.

Figure 7:
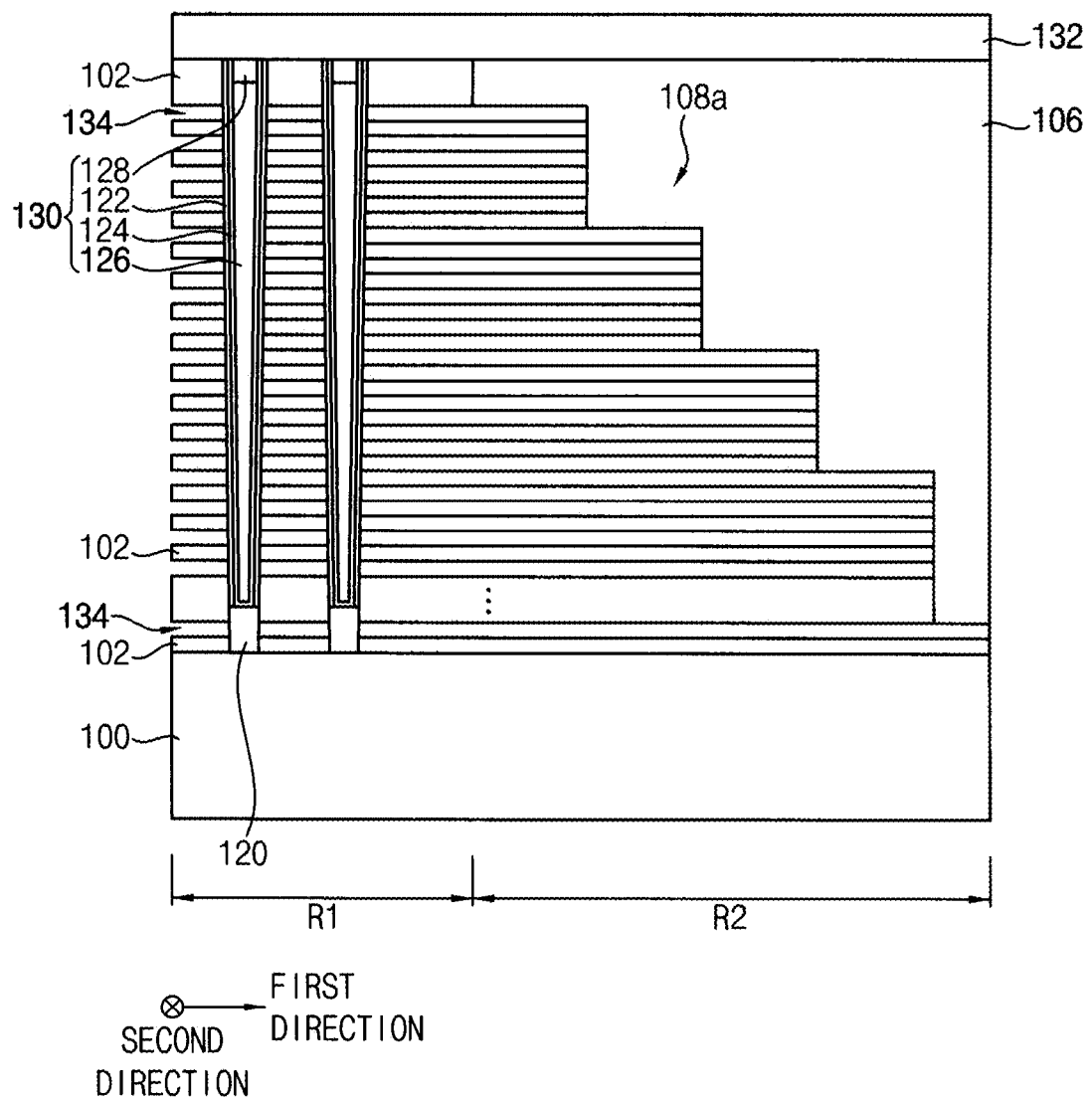

Referring to FIG. 7, an opening (not shown) extending in the first direction may be formed through the step mold structure 108a. The surface of the substrate 100 may be exposed by a lower surface of the opening. As the opening is formed, the step mold structure 108a may be separated.

Thereafter, the sacrificial layer patterns 104 exposed by the openings may be removed to form gaps 134 between the insulation patterns 102. The removing process may include a wet etching process or an isotropic dry etching process.

Figure 8:
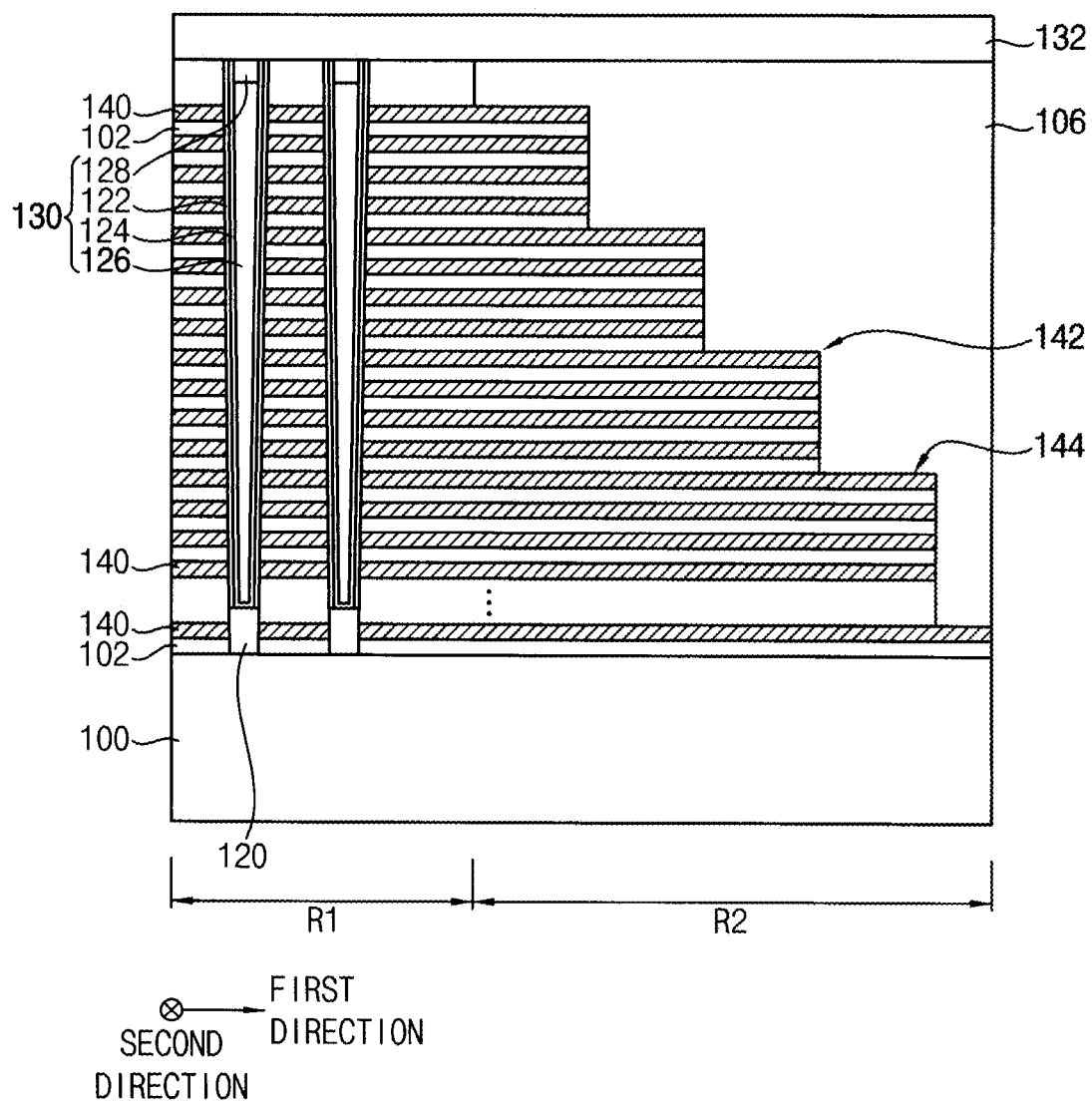

Referring to FIG. 8, a conductive material may fill in the gaps 134 to form conductive patterns on the first and second regions R1 and R2. Thereafter, the conductive material formed in the opening may be removed.

Therefore, a stacked structure including the insulation patterns 102 and the conductive patterns 140 stacked may be formed on the substrate 100. That is, a conductive pattern structure may be formed in the first region R1, and a pad structure 142 having a staircase shape may be formed in the second region R2.

In example embodiments, heights of the gaps 134 may be uniform for each position. Therefore, the conductive material may be easily filled in the gaps 134. Further, the conductive material formed in the opening may be easily removed by subsequent process.

Figure 9:
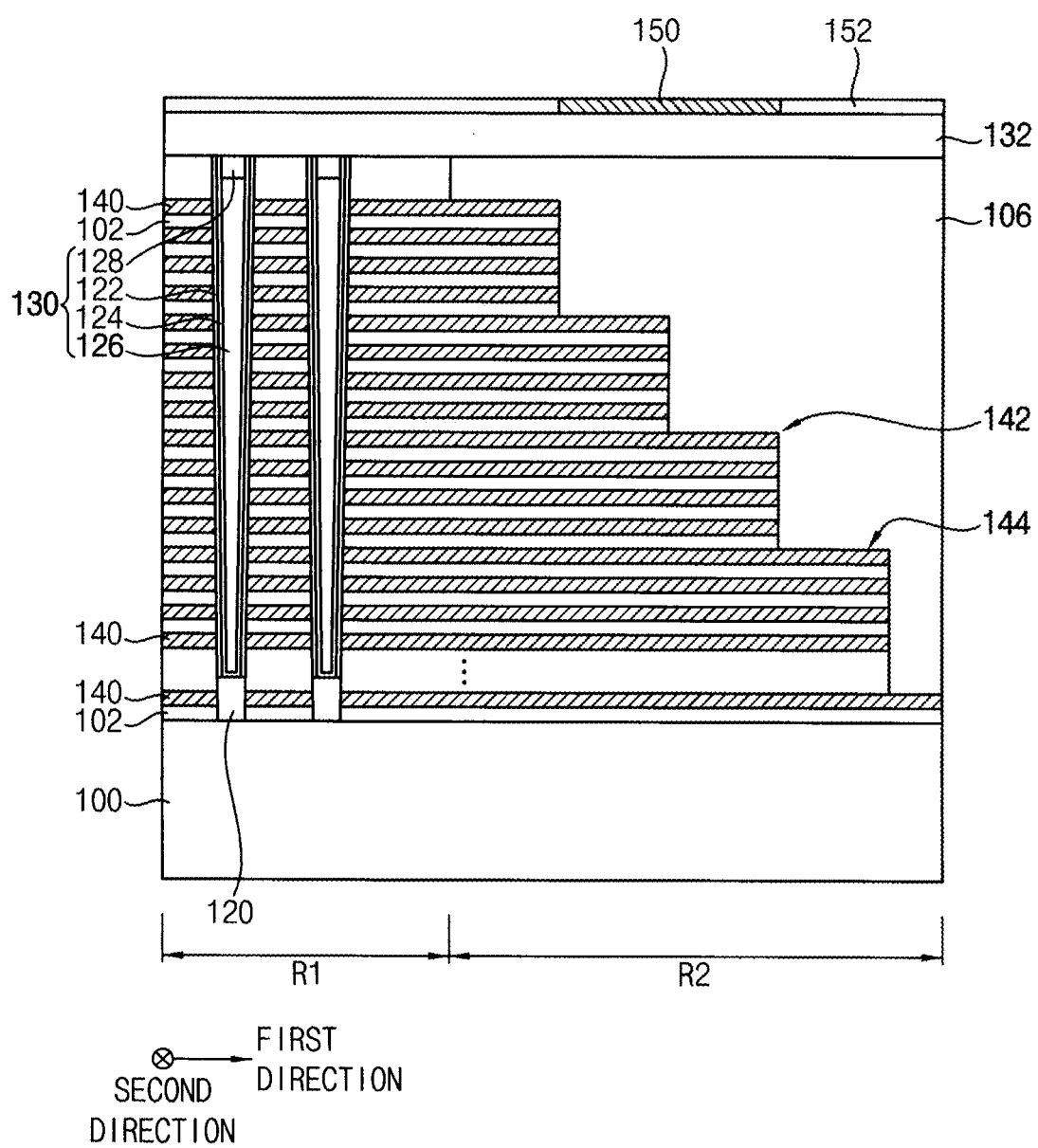

Referring to FIG. 9, a buffer layer may be formed on the second insulating interlayer 132, and the buffer layer may be patterned to form a buffer pattern 150.

In example embodiments, the buffer pattern 150 may include an insulation material having a high etching selectivity with respect to the first insulating interlayer 106.

In example embodiments, the buffer pattern 150 may be formed to have a uniform thickness.

The buffer pattern 150 may be formed on the second insulating interlayer 132 in the second region. The buffer pattern 150 may be disposed to face at least one of the pad patterns 144. The buffer pattern 150 may be disposed to face a portion where over etching defects may occur during forming contact holes exposing the pad pattern 144. For example, the buffer pattern 150 may be one pattern that is not divided. The buffer pattern 150 may be faced to portions for forming a plurality of contact holes.

A third insulating interlayer 152 may be formed on the second insulating interlayer 132 to cover the buffer pattern 150. An upper surface of the third insulating interlayer 152 may be planarized until an upper surface of the buffer pattern 150 may be exposed. Thus, the third insulating interlayer 152 may surround sidewalls of the buffer pattern 150.

In some example embodiments, the buffer pattern 150 may be formed by a damascene process. Particularly, a portion of the second insulating interlayer may be etched to form a trench, and then a buffer layer may be formed in the trench. The buffer layer may be planarized to form the buffer pattern 150.

Figure 10:
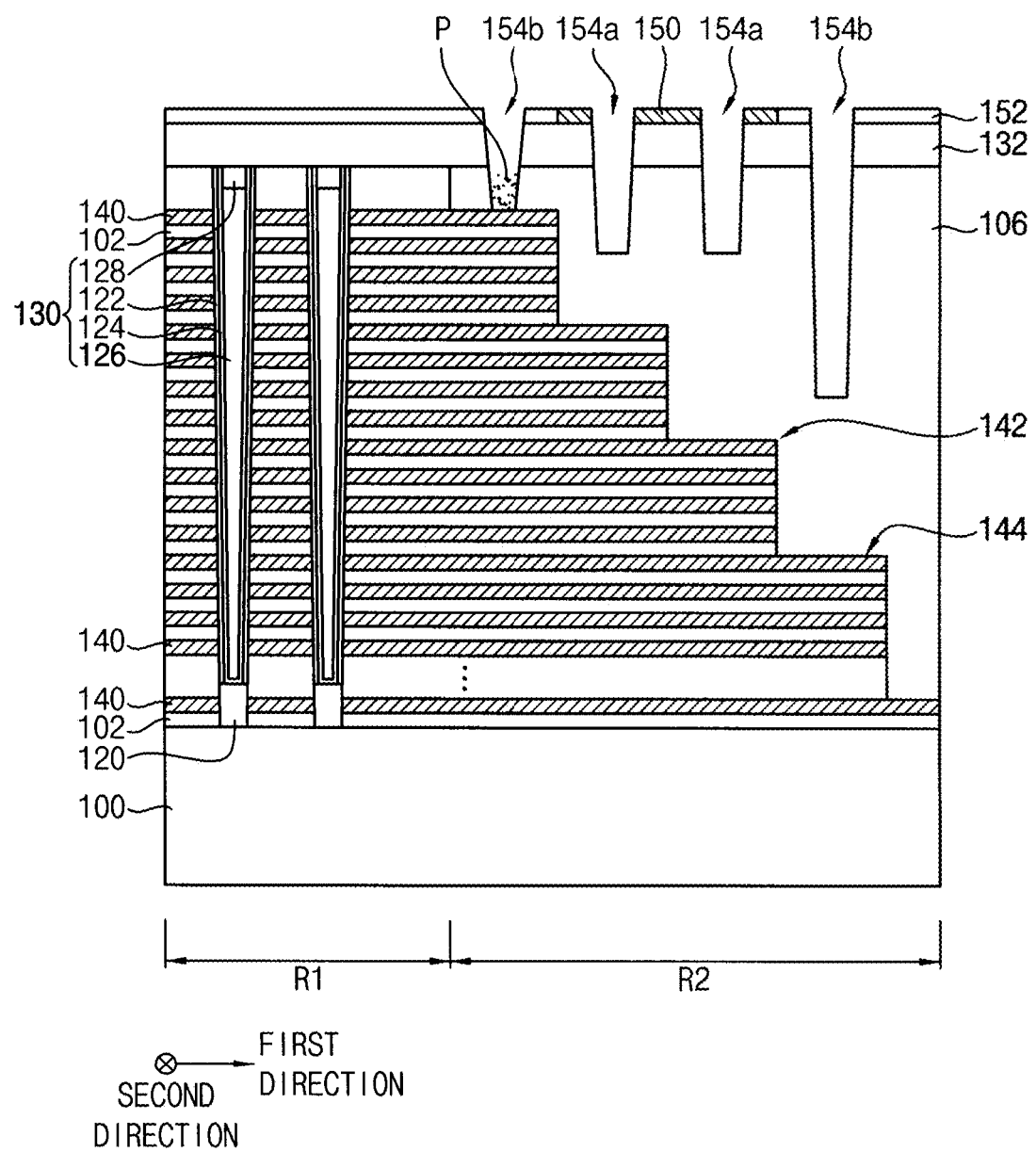
Figure 11:
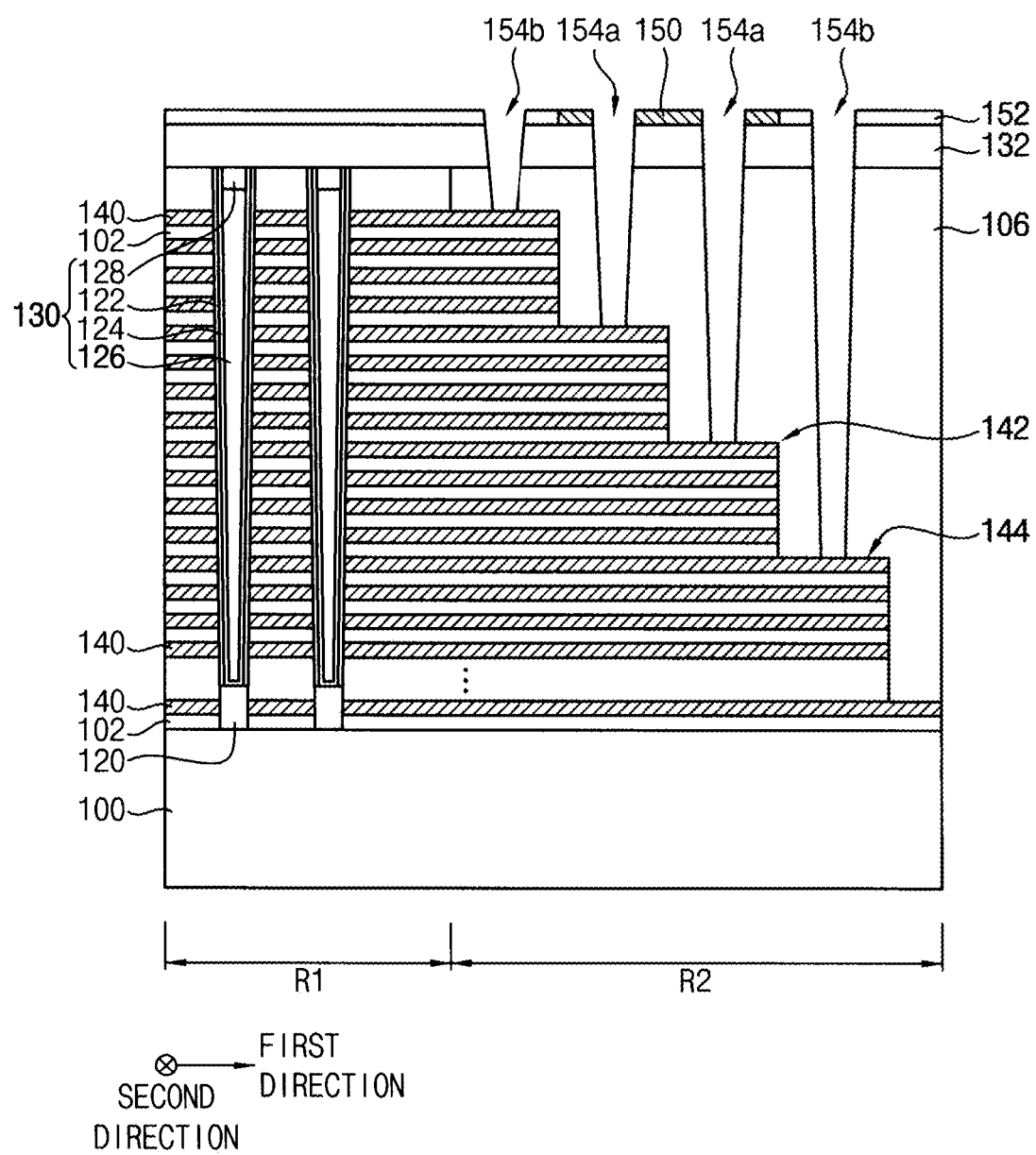

FIGS. 10 and 11, a plurality of contact holes 154a and 154b exposing each of the pad patterns may be formed through the third insulating interlayer 152, the second insulating interlayer 132, the buffer pattern 150 and the first insulating interlayer 106.

First contact holes 154a exposing the pad pattern 144 may be formed through the buffer pattern 150, the second insulating interlayer 132 and the first insulating interlayer 106. The first contact holes 154a may be formed at a portion where the buffer pattern 150 is formed. Second contact holes 154b exposing the pad pattern 144 may be formed through third insulating interlayer 152, the second insulating interlayer 132 and the first insulating interlayer 106. The second contact holes 154b may be formed at a portion where the buffer pattern 150 is not formed.

As described above, the plurality of contact holes 154a and 154b exposing pad patterns having different heights may be formed together by performing the same etching process. However, a thickness of the first insulating interlayer 106 on the pad pattern 144 positioned at an upper step may be different from a thickness of the first insulating interlayer 106 on the pad pattern 144 positioned at a lower step. Therefore, when the etching process is performed to form the contact holes 154a and 154b, etching thicknesses of the insulating interlayer may vary according to positions of the contact holes 154a and 154b. For example, for forming the contact holes 154a and 154b, an etching thickness of the insulating interlayer on the pad pattern 144 disposed at the upper step may be relatively small, and an etching thicknesses of the insulating interlayer on the pad pattern 144 disposed at the lower step may be relatively great.

Therefore, the pad pattern 144 disposed at the upper step may be excessively etched during the etching process for exposing the pad pattern 144 at the lower step. When the pad pattern 144 is excessively etched, the pad pattern 144 may be punched. Further, when the etching thickness is decreased to reduce the excessive etching of the pad pattern 144 at the upper step, the pad pattern 144 at the lower step may not be exposed by the contact hole. Thus, not open defect of the contact hole may occur.

When the etching process is performed for forming a top contact hole on the pad pattern 144 at the uppermost step, large amount polymers P may be filled in the top contact hole. When the polymers P are filled in the top contact hole, the pad pattern 144 formed on a bottom of the contact hole may be not etched by the polymers P. Thus, the pad pattern 144 may not be excessively etched. Therefore, a punching defect due to an excessive etching of the pad pattern 144 at the uppermost step may not occur.

In processes for forming the contact hole, defects due to the excessive etching may frequently occur in the pad patterns 144 positioned between the uppermost step and the lowermost step.

In example embodiments, the buffer pattern 150 may be formed to face the pad patterns 144 positioned between the uppermost step and the lowermost step.

In some example embodiments, when small amount of the polymer is generated in the top contact hole, the punching defect may occur. Therefore, in some example embodiments, the buffer pattern 150 may be formed to face the pad patterns 144 positioned at the uppermost step.

FIG. 10 illustrates a state during an etching process for forming first and second contact holes. As illustrated in FIG. 10, the buffer pattern 150, the second insulating interlayer 132 and the first insulating interlayer 106 of portions for forming the first contact holes 154a may be sequentially etched. Further, the third insulating interlayer 152, the second insulating interlayer 132 and the first insulating interlayer 106 of portions for forming the second contact holes 154b may be sequentially etched. In this case, since the buffer pattern 150 has an etching rate lower than an etching rate of silicon oxide, the portions for forming the first contact holes 154a may be etched slower than the portions for forming the second contact holes 154b, in an initial etching process. However, an uppermost second contact hole 154b may be filled by a polymer during the initial etching process, and thus the pad pattern under the uppermost second contact hole 154b may not be additionally etched.

Subsequently, when the etching process is continuously performed, the first and second contact holes 154a and 154b may be formed on upper surfaces of the pad patterns 144, respectively, as shown in FIG. 11. As the buffer pattern 150 is formed, the pad patterns 144 positioned above the lowermost step may not be excessively etched during the etching process to expose the pad pattern 144 at the lowermost step. Further, the etching process may be sufficiently performed to expose the pad pattern 144 at the lowermost step. Thus, a contact not open defect may decrease.

After performing the etching process, a cleaning process may be performed, and polymers included in the contact hole at the uppermost step may be removed by the cleaning process.

Meanwhile, the buffer pattern 150 may be positioned to face a position in which defects due to the excessive etching may frequently occur in the pad patterns 144. However, the position for forming the buffer pattern 150 may not be limited to the above-described one.

Figure 12:
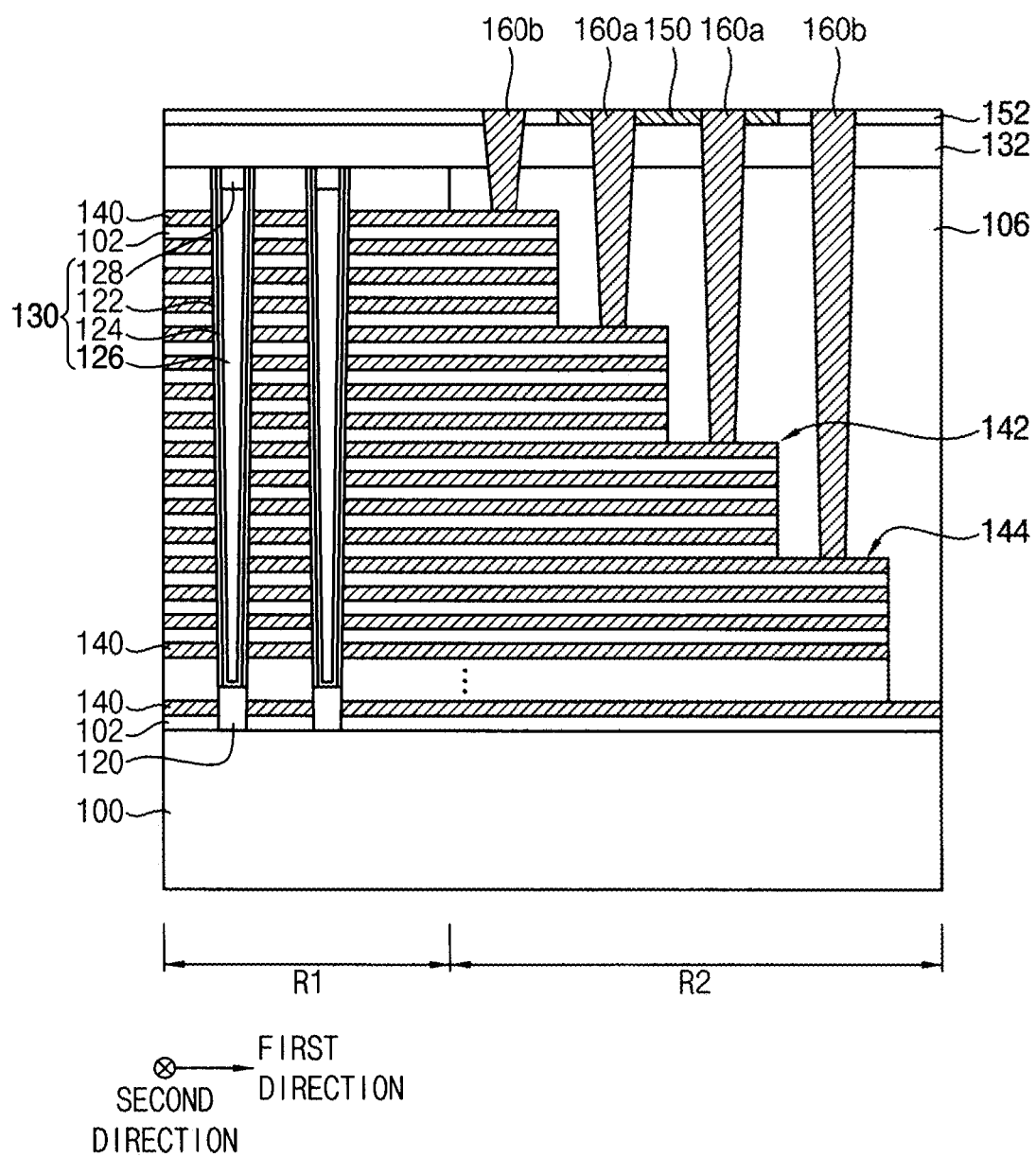

Referring to FIG. 12, first and second contact plugs 160a and 160b may be formed in the first and second contact holes 154a and 154b, respectively.

Particularly, a barrier metal layer may be formed on the buffer pattern 150, the third insulating interlayer 152, and sidewalls and bottom surfaces of the first and second contact holes 154a and 154b. A metal layer may be formed on the barrier metal layer. The metal layer and the barrier metal layer may be planarized until upper surfaces of the third insulating interlayer 152 and the buffer pattern 150 may be exposed to form the first and second contact plugs 160a and 160b.

Figure 16:
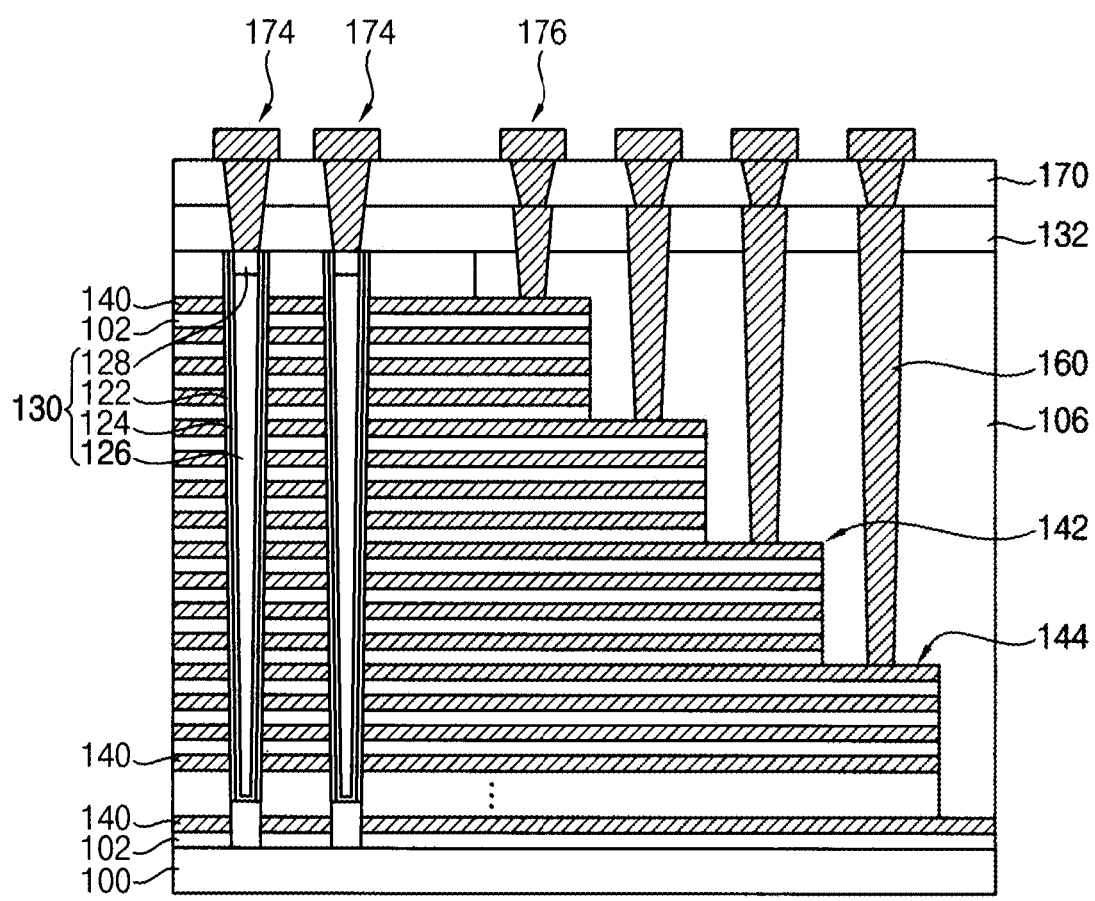

In some example embodiments, the planarization process may be performed until upper surface of the second insulating interlayer 132 may be exposed. Therefore, the third insulating interlayer 152 and the buffer pattern 150 may be removed by the planarization process. In this case, when subsequent processes are performed in the same manner, the vertical semiconductor device as shown in FIG. 16 may be manufactured.

Referring to FIG. 1 again, a fourth insulating interlayer 170 may be formed on the third insulating interlayer 152. A bit line structure 174 may be formed on the fourth insulating interlayer 170. The bit line structure 174 may pass through the second to fourth insulating interlayers 132, 152, and 170, so that the bit line structure 174 may be electrically connected to the upper conductive pattern 128.

Further, an upper wiring 176 may be formed on the fourth insulating interlayer 170. The upper wiring 176 may pass through the fourth insulating interlayer 170, so that the upper wiring 176 may be electrically connected to the first and second contact plugs 160a and 160b.

Figure 13:
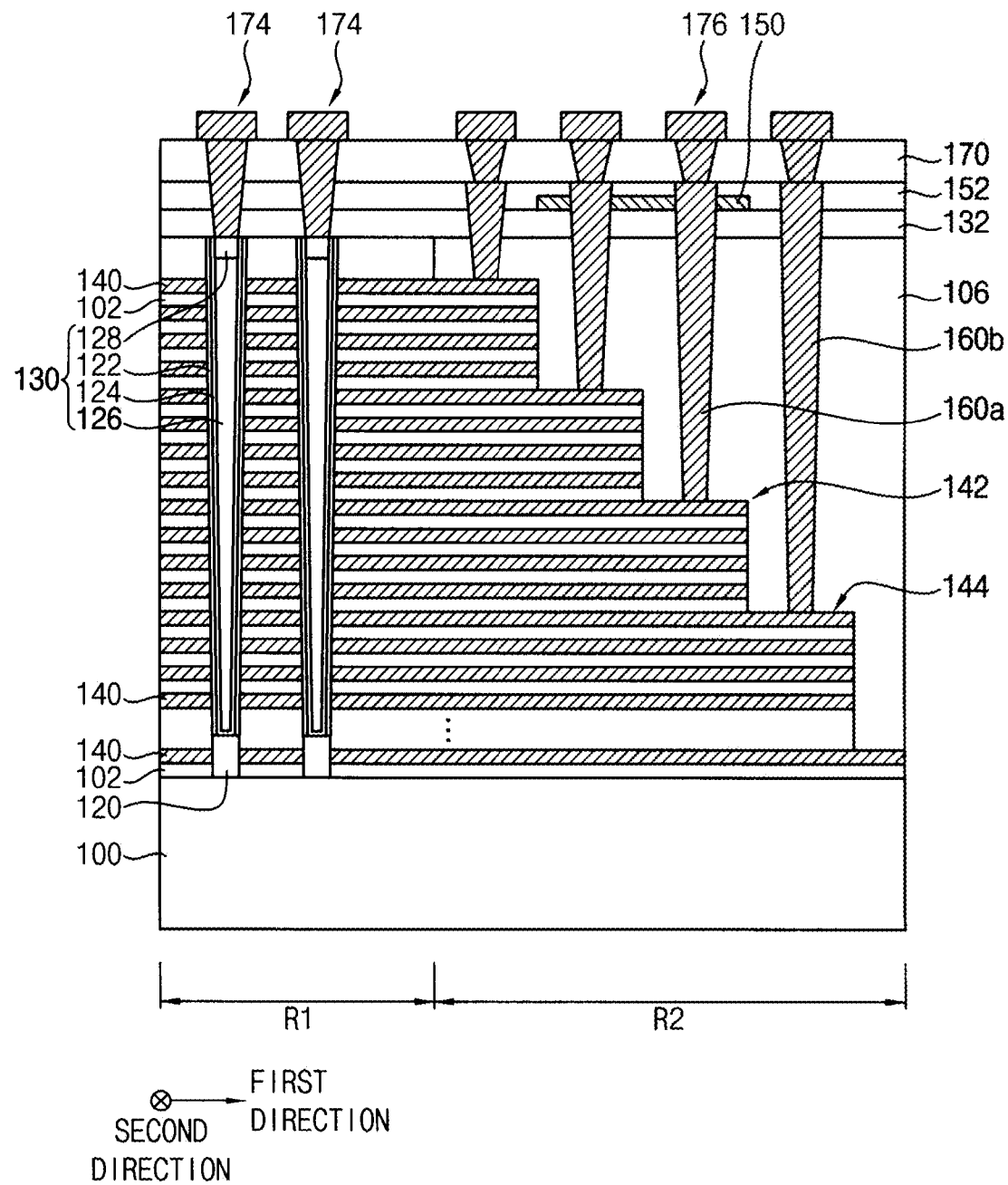

FIG. 13 is a cross-sectional view illustrating a vertical semiconductor device in accordance with example embodiments.

The vertical semiconductor device shown in FIG. 13 may be substantially the same as the vertical semiconductor device shown in FIG. 1, except for the thickness of the third insulating interlayer.

Referring to FIG. 13, the third insulating interlayer 152 may cover the buffer pattern 150. That is, the third insulating interlayer 152 may be disposed on the buffer pattern 150. An upper surface of the third insulating interlayer 152 may be flat.

In example embodiments, an upper surface of the buffer pattern 150 may be lower than an upper surface of the first contact plug 160a.

Figure 14:
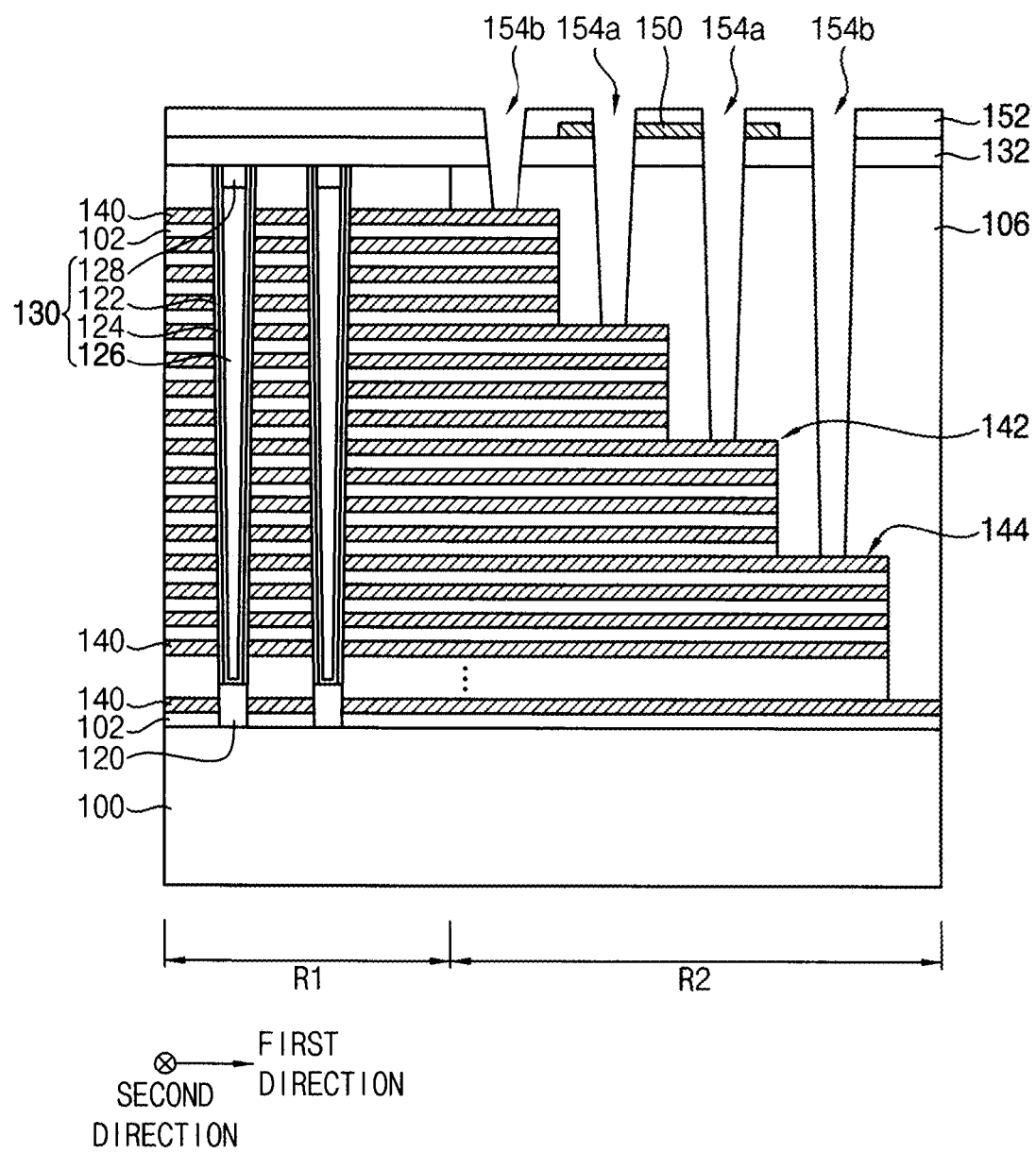
Figure 15:
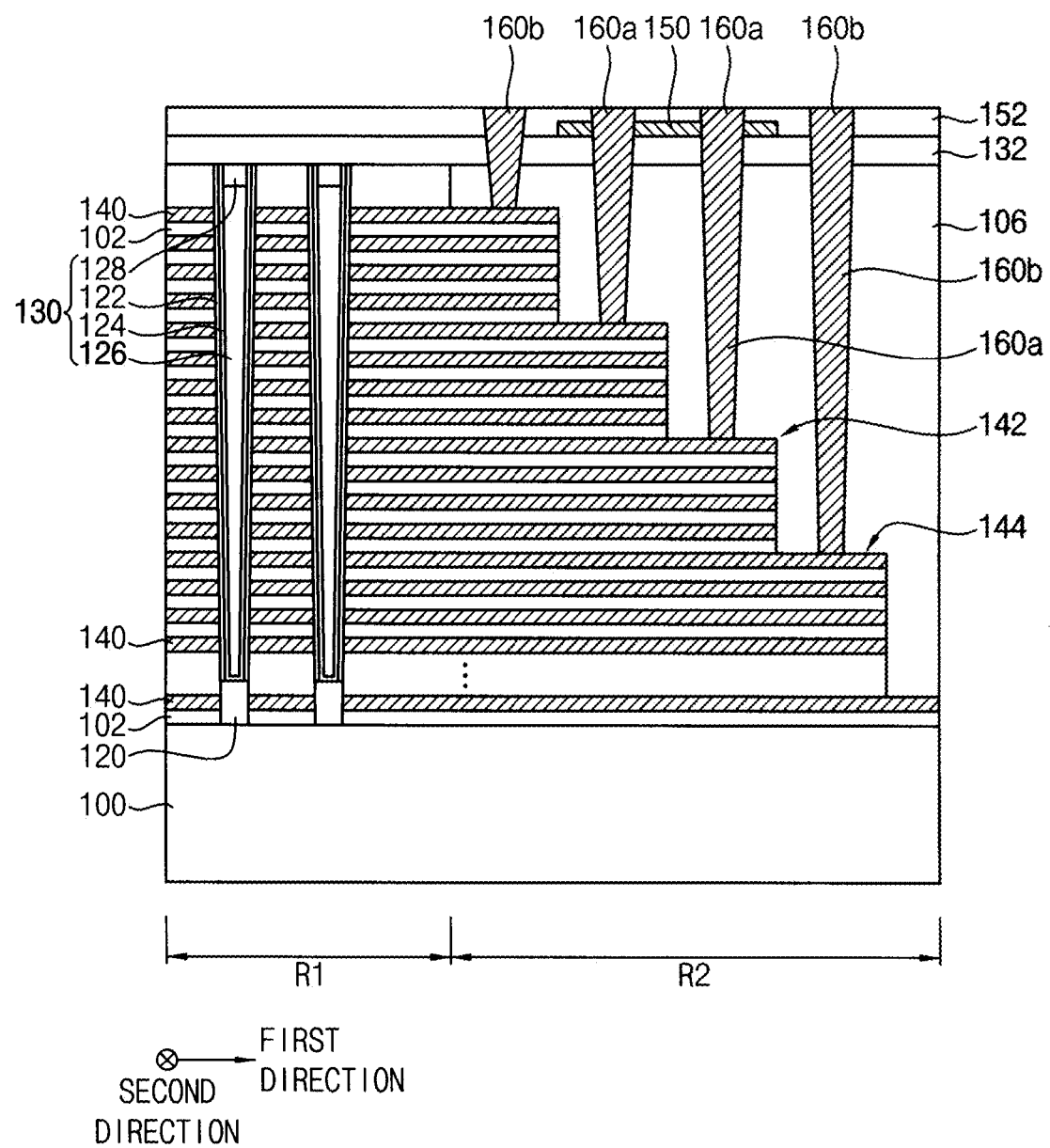

FIGS. 14 and 15 are cross-sectional views illustrating a method of manufacturing a vertical semiconductor device in accordance with example embodiments.

Referring to FIG. 14, first, the same process as illustrated with reference to FIGS. 4 to 8 may be performed. Then, the buffer layer may be formed on the second insulating interlayer 132, and the buffer layer may be patterned to form the buffer pattern 150.

The third insulating interlayer 152 may be formed on the second insulating interlayer 132 to cover the buffer pattern 150. Thereafter, an upper surface of the third insulating interlayer 152 may be planarized while the upper surface of the buffer pattern 150 is not exposed.

Thereafter, the first contact holes 154a exposing the pad pattern 144 may be formed through the third insulating interlayer 152 the buffer pattern 150, the second insulating interlayer 132 and the first insulating interlayer 106. The first contact holes 154a may be formed at a portion where the buffer pattern 150 is formed. The second contact holes 154b exposing the pad pattern 144 may be formed through third insulating interlayer 152, the second insulating interlayer 132 and the first insulating interlayer 106. The second contact holes 154b may be formed at a portion where the buffer pattern 150 is not formed.

Referring to FIG. 15, the first and second contact plugs 160a and 160b may be formed in the first and second contact holes 154a and 154b, respectively.

Referring to FIG. 13 again, subsequently, the fourth insulating interlayer 170 may be formed on the third insulating interlayer 152. The bit line structure 174 and the upper wiring 176 may be formed on the fourth insulating interlayer 170. The bit line structure 174 may be electrically connected to the upper conductive pattern 128. The upper wiring 176 may be electrically connected to the first and second contact plugs 160a and 160b. Thus, the vertical semiconductor device shown in FIG. 13 may be manufactured.

FIG. 16 is a cross-sectional view illustrating a vertical semiconductor device in accordance with example embodiments.

The vertical semiconductor device shown in FIG. 16 may be substantially the same as the vertical semiconductor device shown in FIG. 1, except that the buffer pattern and the third insulating interlayer may be not included in the vertical semiconductor device.

Referring to FIG. 16, a buffer pattern facing the contact plug 160 may be omitted. Further, a third insulating interlayer (see 152 in FIG. 1) may not be formed on the second insulating interlayer 132.

Figure 17:
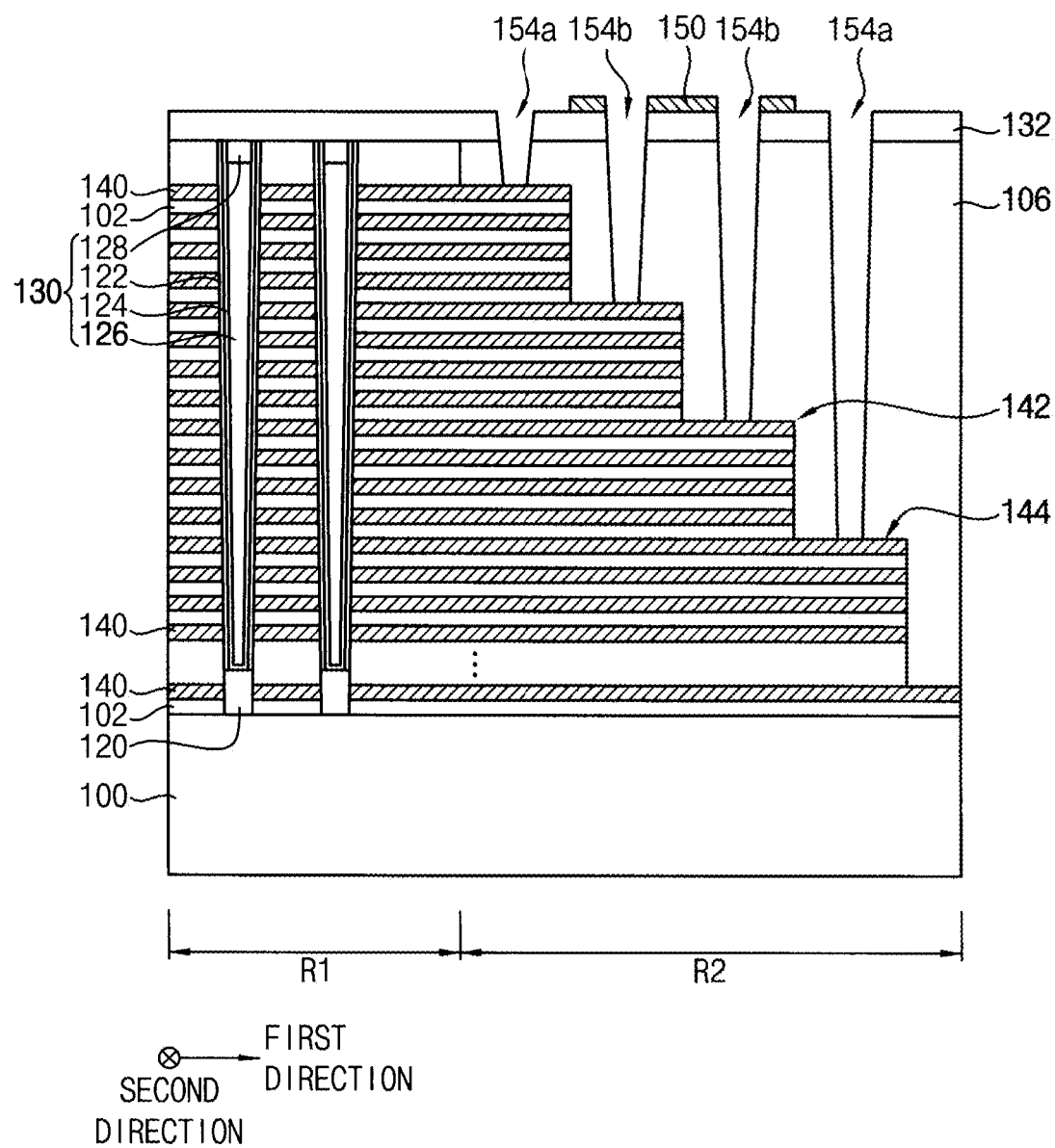
Figure 18:
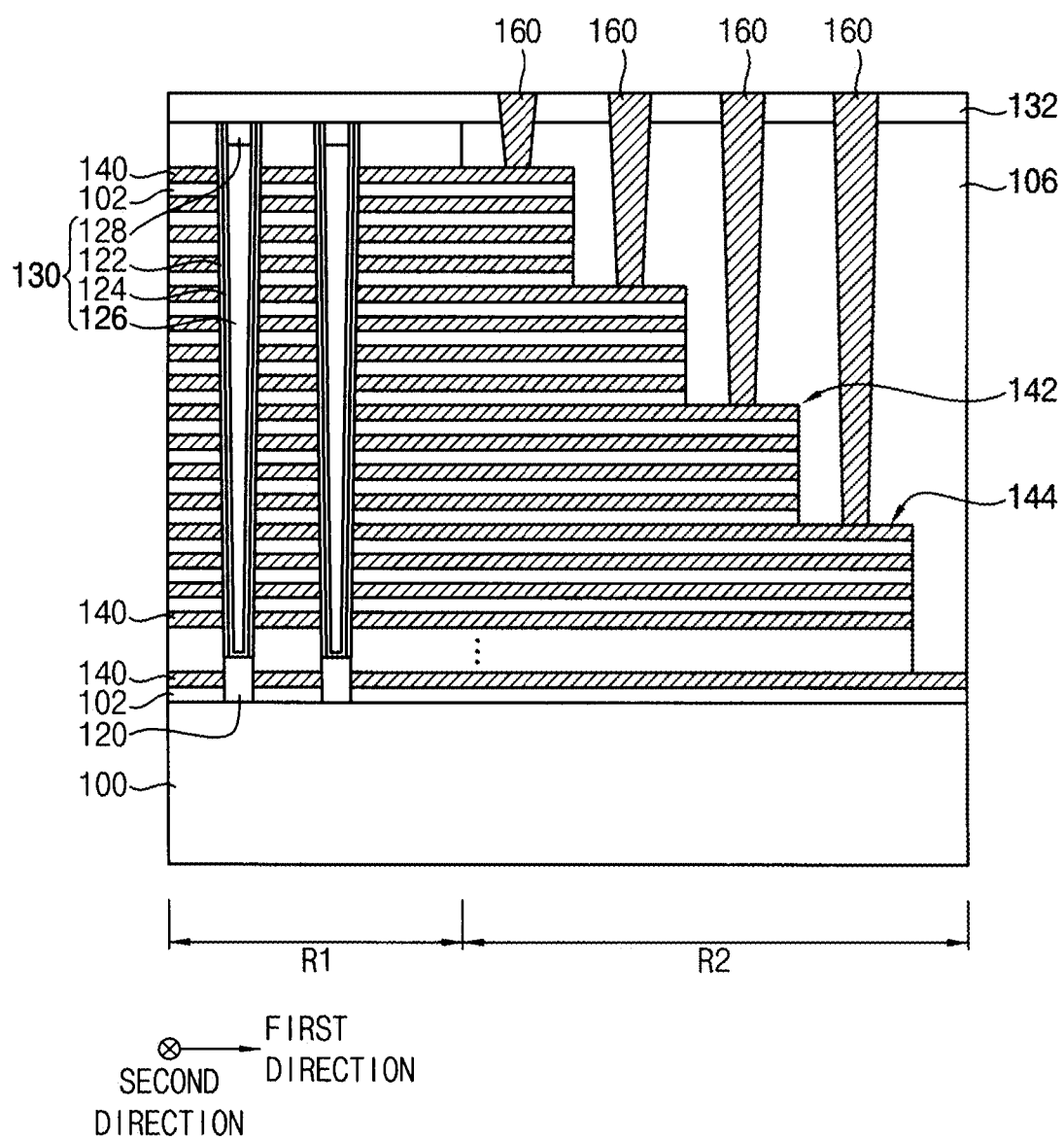

FIGS. 17 and 18 are cross-sectional views illustrating a method of manufacturing a vertical semiconductor device in accordance with example embodiments.

Referring to FIG. 17, first, the same process as illustrated with reference to FIGS. 4 to 8 may be performed. Then, the buffer layer may be formed on the second insulating interlayer 132, and the buffer layer may be patterned to form the buffer pattern 150.

Thereafter, the contact holes 154a and 154b may be formed through the second insulating interlayer 132, the buffer pattern 150 and the first insulating interlayer 106 to expose each of the pad patterns 144.

That is, the first contact holes 154a exposing the pad pattern 144 may be formed through the buffer pattern 150, the second insulating interlayer 132 and the first insulating interlayer 106. The first contact holes 154a may be formed at a portion where the buffer pattern 150 is formed. The second contact holes 154b exposing the pad pattern 144 may be formed through the second insulating interlayer 132 and the first insulating interlayer 106. The second contact holes 154b may be formed at a portion where the buffer pattern 150 is not formed.

Referring to FIG. 18, contact plugs 160 may be formed in the first and second contact holes 154a and 154b.

Particularly, a barrier metal layer may be formed on the buffer pattern 150, the second insulating interlayer 132 and sidewalls and bottom surfaces of the first and second contact holes 154a and 154b. A metal layer may be formed on the barrier metal layer. The metal layer and the barrier metal layer may be planarized until upper surfaces of the second insulating interlayer 132 may be exposed to form the contact plugs 160. In the planarization process, the buffer pattern 150 may be removed. Therefore, the contact plug 160 may not pass through the buffer pattern.

Referring to FIG. 16 again, subsequently, the fourth insulating interlayer 170 may be formed on the third insulating interlayer 152. The bit line structure 174 and the upper wiring 176 may be formed on the fourth insulating interlayer 170. The bit line structure 174 may be electrically connected to the upper conductive pattern 128. The upper wiring 176 may be electrically connected to the contact plugs 160a and 160b. Thus, the vertical semiconductor device shown in FIG. 16 may be manufactured.

Figure 19:
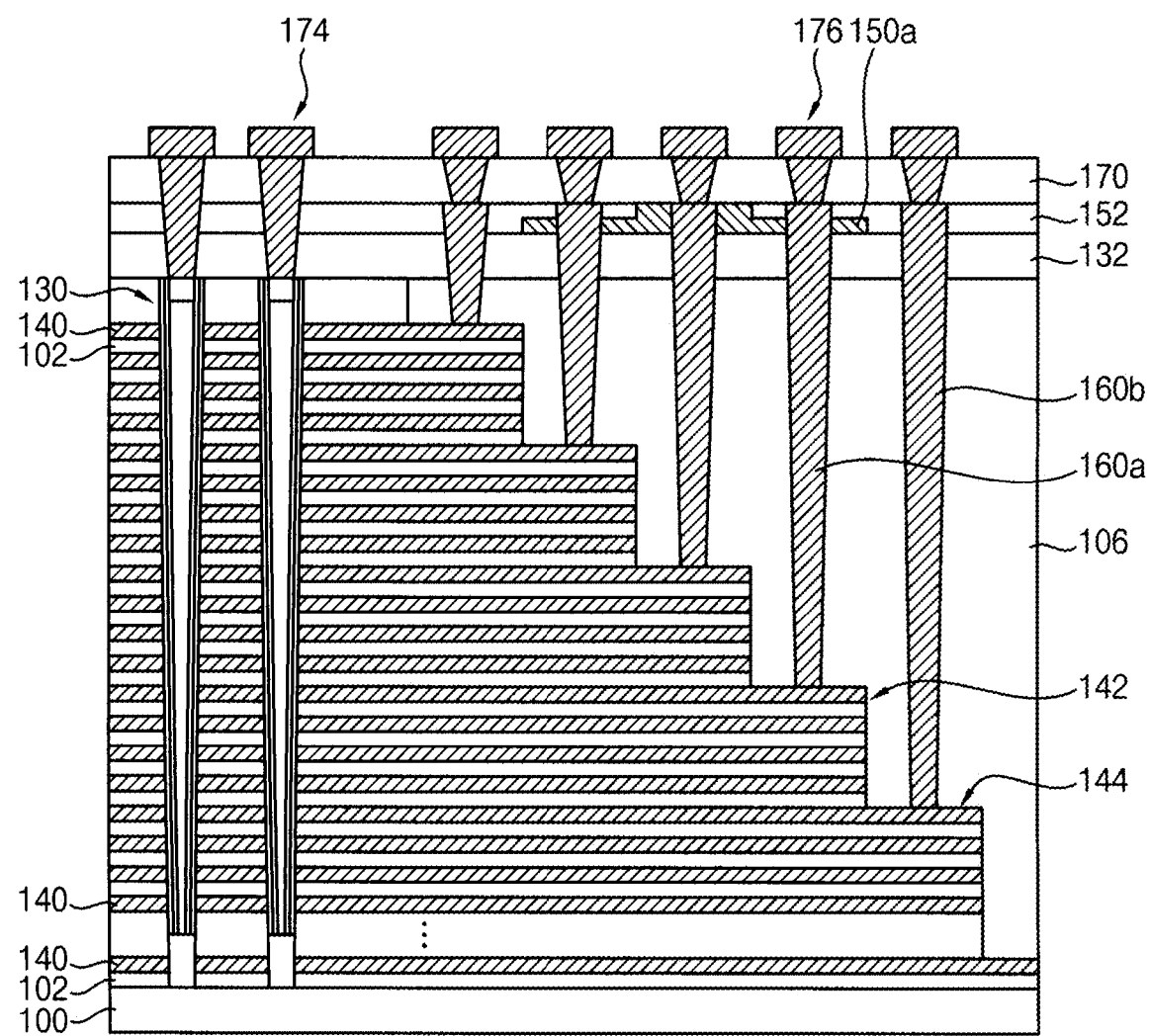
Figure 20:
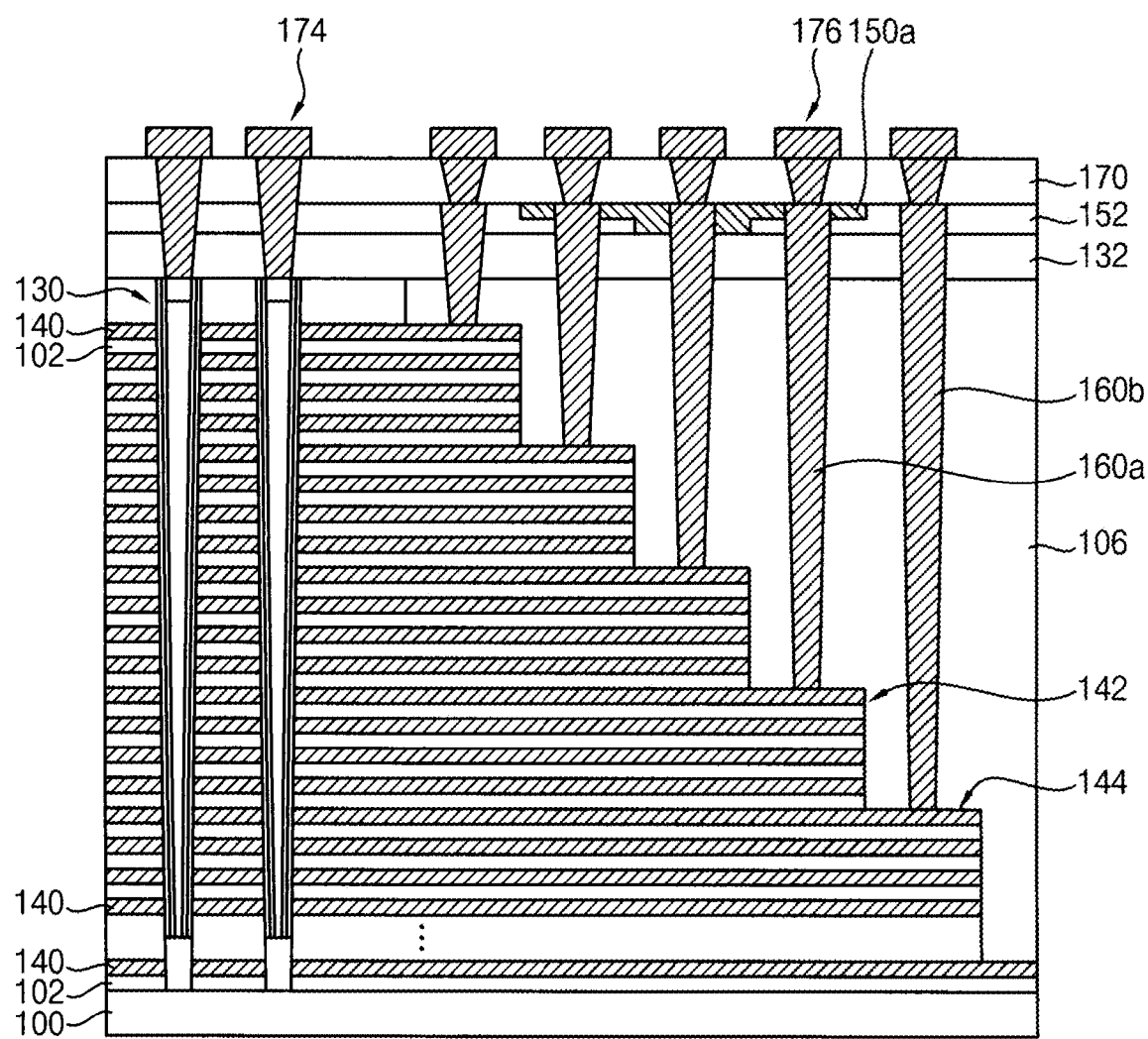

FIG. 19 is a cross-sectional view illustrating a vertical semiconductor device in accordance with example embodiments. FIG. 20 is a cross-sectional view illustrating a vertical semiconductor device in accordance with example embodiments.

Each of the vertical semiconductor devices shown in FIGS. 19 and 20 may be substantially the same as the vertical semiconductor device shown in FIG. 1, except of a thickness of the buffer pattern according to positions thereof.

Referring to FIG. 19, the buffer pattern 150a may have a different thickness according to each portion where the pad pattern 144 may be excessively etched in the etching process for forming the contact hole. In example embodiments, above a portion of the pad pattern 144 where punching defect may frequently occur, the buffer pattern 150a may have a first thickness. Above a portion adjacent to the portion of the pad pattern 144 where punching defect may frequently occur, the buffer pattern 150a may be a second thickness less than the first thickness.

For example, in a portion for forming the first contact plug, a portion of the buffer pattern 150a facing the pad patterns 144 positioned between an uppermost step and a lowermost step may have the first thickness. In the portion for forming the first contact plug, a portion of the buffer pattern 150a facing the pad patterns 144 positioned at the uppermost step and the lowermost step may have the second thickness less than the first thickness.

For example, a portion of the buffer pattern 150a facing the pad patterns 144 positioned at a center portion of steps in the first direction may have the first thickness that may be greatest thickness. Also, a portion of the buffer pattern 150a adjacent to the portion having the first thickness may have a thickness less than the first thickness.

In example embodiments, as shown in FIG. 19, an upper surface of a portion of the buffer pattern 150a may have a height substantially the same as heights of upper surfaces of the first contact plugs 160a.

In some example embodiments, as shown in FIG. 20, an entire upper surface of the buffer pattern 150a may have a height substantially the same as the upper surfaces of the first contact plugs 160a.

Figure 21:
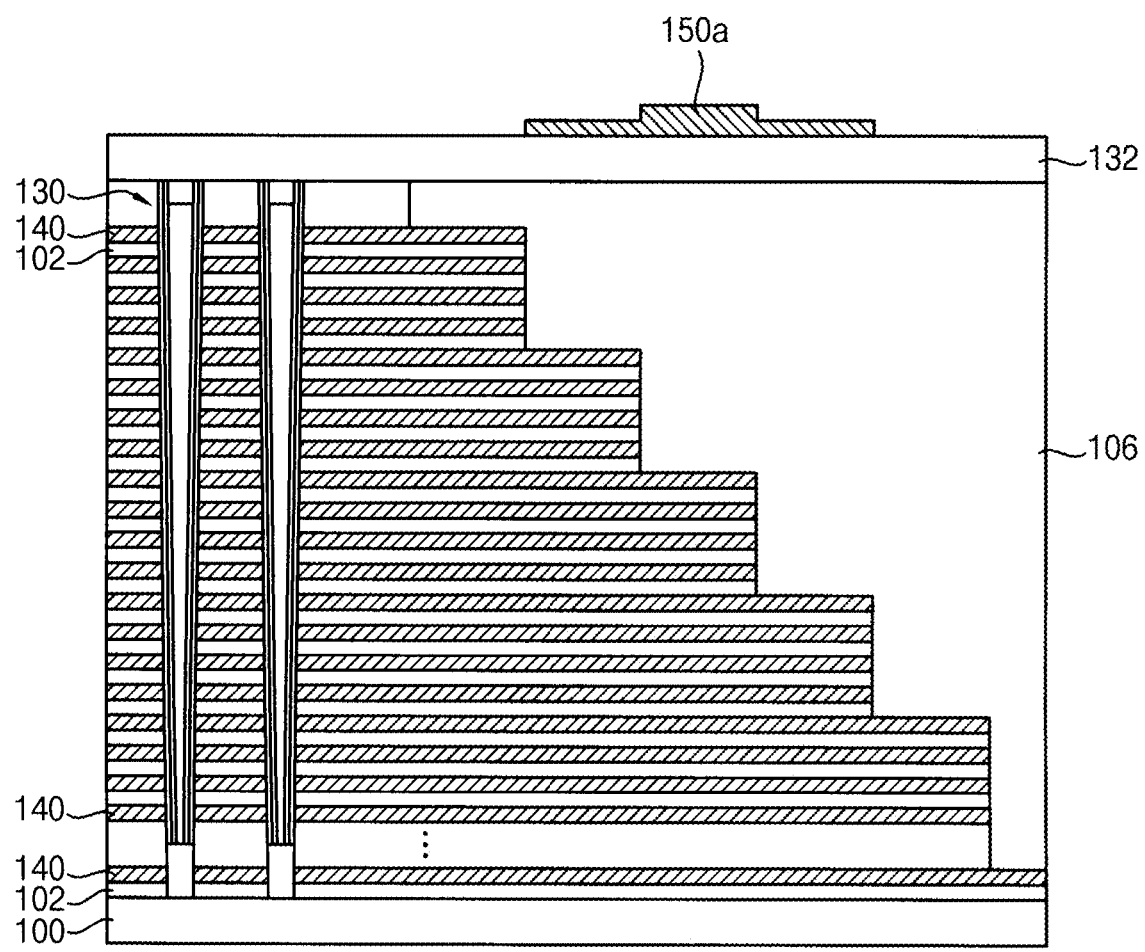
Figure 22:
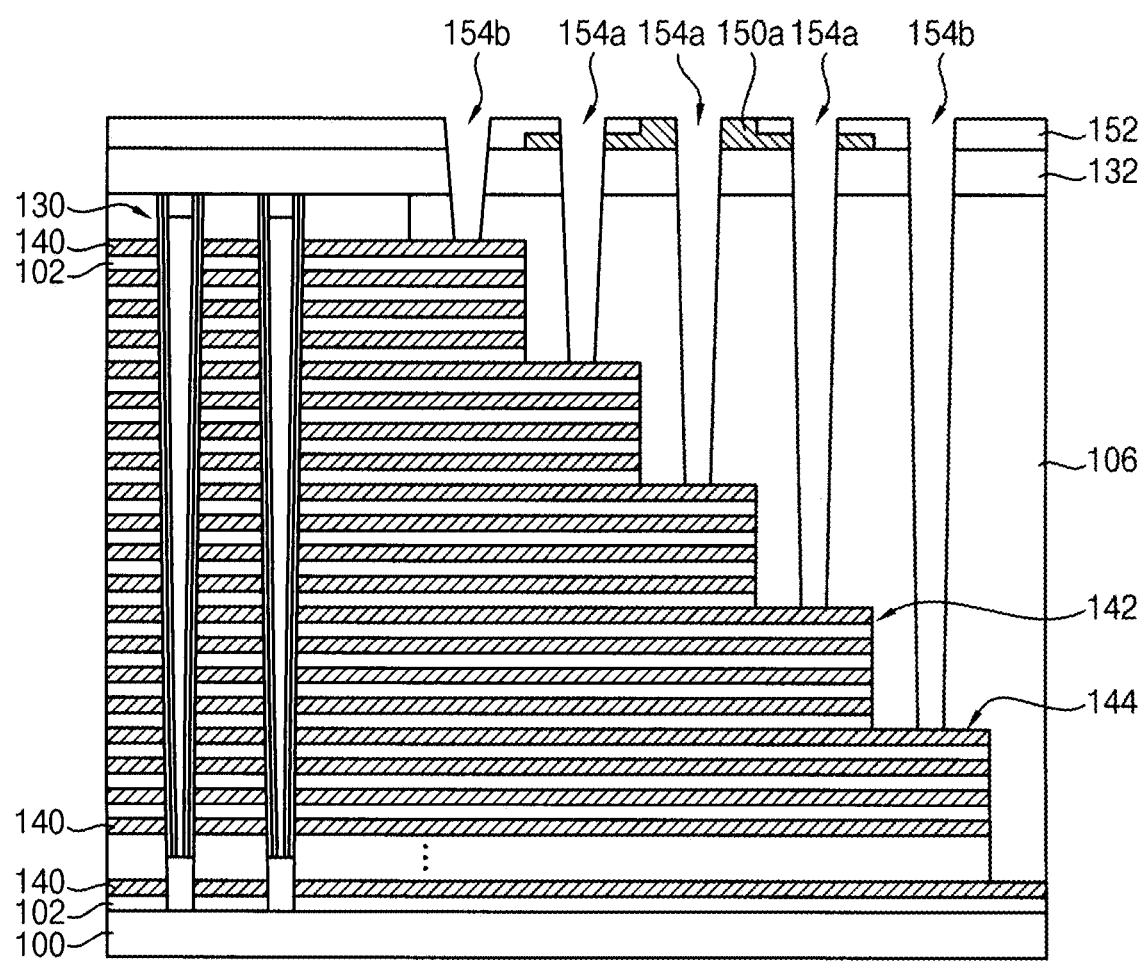
Figure 23:
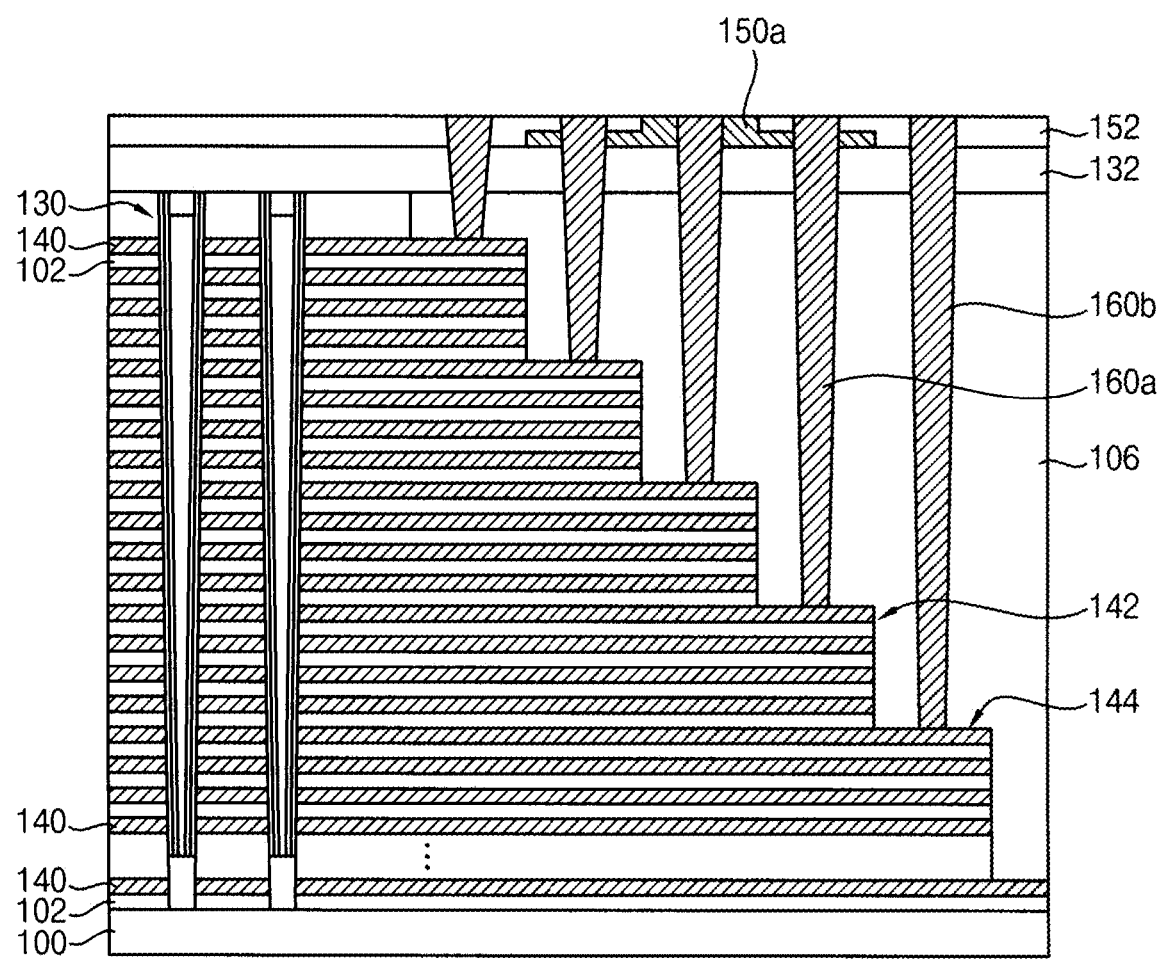

FIGS. 21 to 23 are cross-sectional views illustrating a method of manufacturing a vertical semiconductor device in accordance with example embodiments.

Referring to FIG. 21, first, the same process as illustrated with reference to FIGS. 4 to 8 may be performed. Then, the buffer layer may be formed on the second insulating interlayer 132, and the buffer layer may be patterned to form a buffer pattern 150a. The buffer pattern 150a may be formed to have a different thickness according to positions thereof.

In example embodiments, the buffer layer may be formed, and an etching mask may be formed to partially etch the buffer layer. Also, the etching mask may be partially removed by a trimming process to form a trimmed etching mask. Further, the buffer layer may be etched using the trimmed etching mask. The buffer pattern 150a may be formed to have a staircase shape at an edge portion thereof. Therefore, the vertical semiconductor device illustrated in FIG. 19 may be manufactured by subsequent processes.

In some example embodiments, the buffer pattern 150a may be formed by a damascene process. That is, a third insulating interlayer may be formed on the second insulating interlayer 132, and a portion of the third insulating interlayer may be etched to form a trench. Further, a buffer layer may be formed in the trench, and the buffer layer may be planarized to form the buffer pattern 150a having a shape the same as the buffer pattern as shown in FIG. 20. Therefore, the vertical semiconductor device as shown in FIG. 19 may be manufactured by subsequent processes.

Referring to FIG. 22, the third insulating interlayer 152 may be formed to cover the buffer pattern 150a. The third insulating interlayer 152 may be planarized until an upper surface of the buffer pattern 150a may be exposed.

Thereafter, first and second contact holes 154a and 154b may be formed through the third insulating interlayer 152, the second insulating interlayer 132, the buffer pattern 150a and the first insulating interlayer 106 to expose the pad patterns 144.

As the buffer pattern 150a is formed, a defect due to an excessive etching of the pad pattern 144 may decrease in an etching process of forming the first and second contact holes 154a and 154b.

Referring to FIG. 23, the first and second contact plugs 160a and 160b may be formed in the first and second contact holes 154a and 154b, respectively.

Particularly, a barrier metal layer may be formed on the third insulating interlayer 152, the buffer pattern 150a and sidewalls and bottom surfaces of the first and second contact holes 154a and 154b. A metal layer may be formed on the barrier metal layer. The metal layer and the barrier metal layer may be planarized until upper surfaces of the third insulating interlayer 152 and the buffer pattern 150a may be exposed.

In some example embodiments, the second insulating interlayer 132 may be removed by the planarization process. Therefore, the third insulating interlayer 152 and the buffer pattern 150a may be removed by the planarization process. In this case, when the subsequent processes are performed in the same manner, the vertical semiconductor device as shown in FIG. 16 may be manufactured.

Thereafter, the fourth insulating interlayer 170, the bit line structure 174 and the upper wiring 176 may be formed on the third insulating interlayer 152. Thus, the semiconductor device shown in FIG. 19 may be manufactured.

Figure 24:
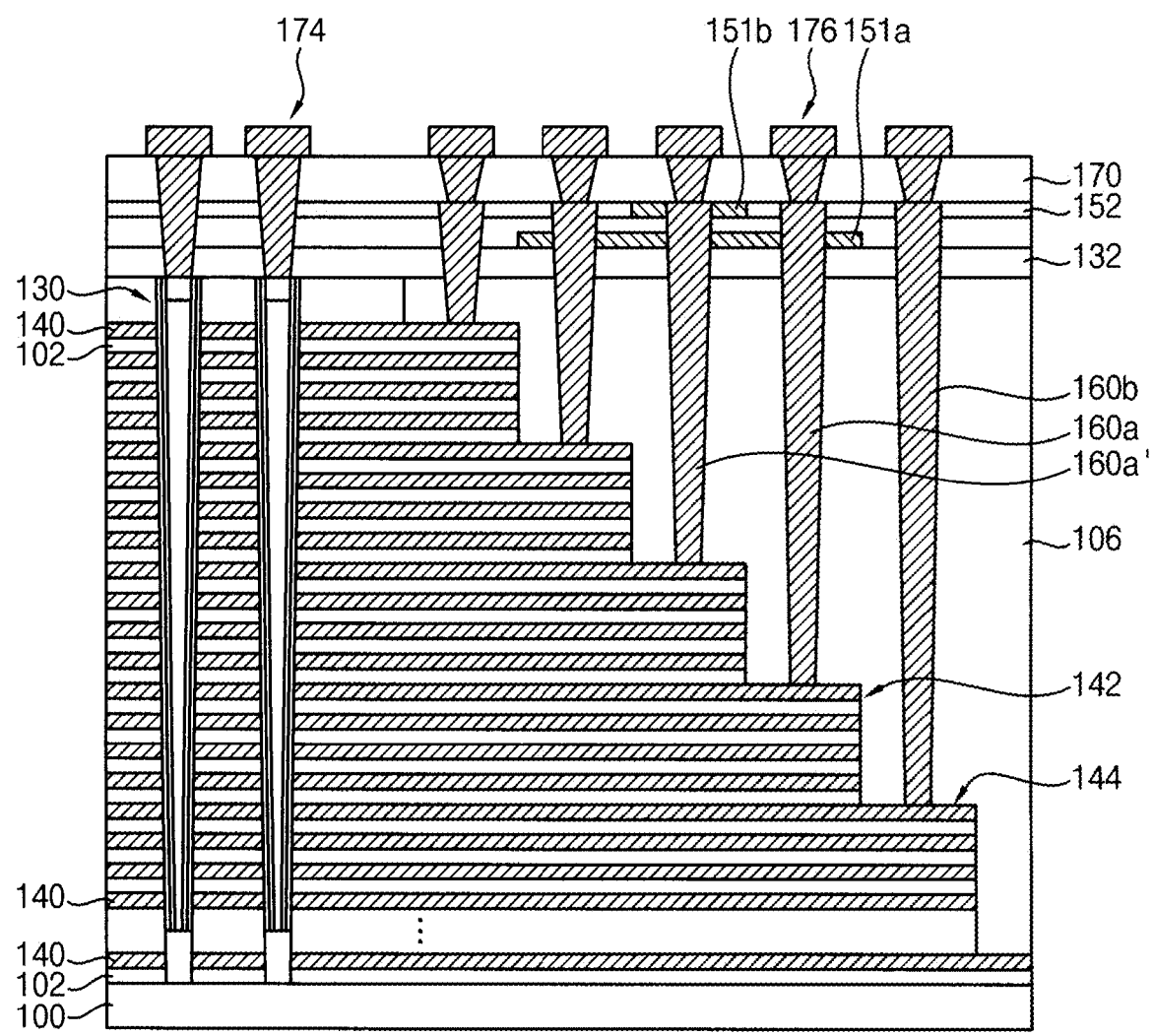
Figure 25:
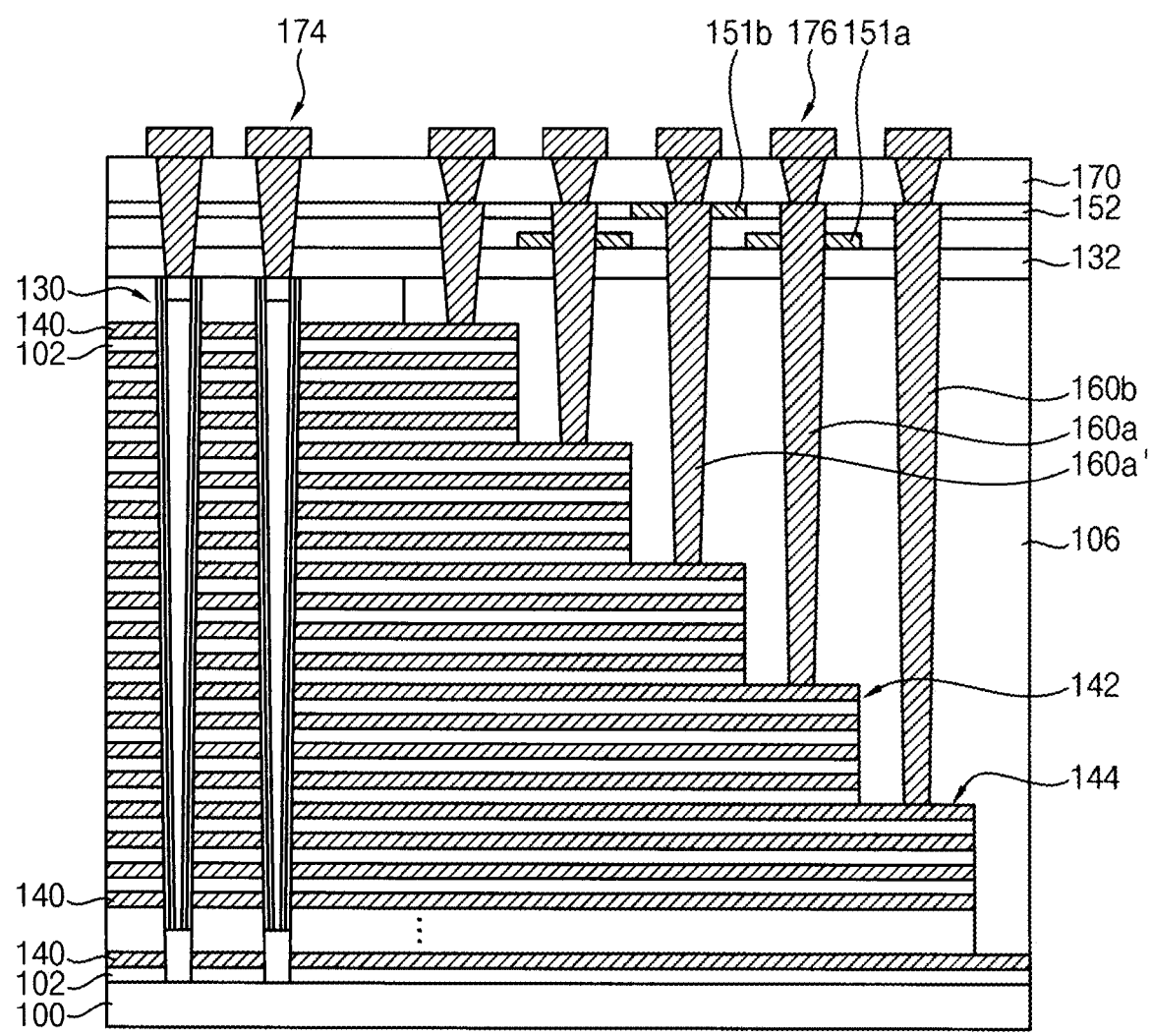

FIG. 24 is a cross-sectional view illustrating a vertical semiconductor device in accordance with example embodiments. FIG. 25 is a cross-sectional view illustrating a vertical semiconductor device in accordance with example embodiments.

Each of the vertical semiconductor devices shown in FIGS. 24 and 25 is substantially the same as the vertical semiconductor device shown in FIG. 1, except that the buffer pattern includes at least two patterns.

Referring to FIG. 24, the buffer pattern may include a first buffer pattern 151a and a second buffer pattern 151b. The second buffer pattern 151b may be disposed on the first buffer pattern 151a. The first and second buffer patterns 151a and 151b may be spaced apart from each other in the vertical direction. In example embodiments, the second buffer pattern 151b may be disposed to overlap the first buffer pattern 151a.

In example embodiments, the first buffer pattern 151a and the second buffer pattern 151b may be formed of the same material or different materials.

In example embodiments, the first buffer pattern 151a and the second buffer pattern 151b may have the same thickness or may have different thicknesses.

In example embodiments, the second buffer pattern 151b may be additionally disposed at a portion where the punching defect of the pad pattern 144 may frequently occur. Thus, some of the first contact plugs 160a may pass through the first buffer pattern 151a, and some of the first contact plugs 160a may pass through the first and second buffer patterns 151a and 151b.

In example embodiments, the buffer patterns may be formed of two or more layers being spaced apart from each other in the vertical direction.

As the first and second buffer patterns 151a and 151b are included, defects of the pad pattern 144 may decrease.

Referring to FIG. 25, the buffer pattern may include a first buffer pattern 151a and a second buffer pattern 151b. In example embodiments, the second buffer pattern 151b may not overlap with the first buffer pattern 151a.

In example embodiments, the first buffer pattern 151a and the second buffer pattern 151b may be formed of the same material. In this case, the first buffer pattern and the second buffer pattern may have different thicknesses. For example, the buffer pattern having relatively great thickness may at a position where the punching defect of the pad pattern 144 may frequently occur.

In example embodiments, the first buffer pattern 151a and the second buffer pattern 151b may be formed of different materials. For example, the first and second buffer patterns 151a and 151b may include materials having etching rates to each other, in the etching process of the silicon oxide. In this case, the first buffer pattern 151a and the second buffer pattern 151b may have the same thickness or different thicknesses. In example embodiments, a buffer pattern including a material having a lower etching rate in the etching process of the silicon oxide may be disposed at a position where the punching defect of the pad pattern 144 may frequently occur.

As the first and second buffer patterns 151a and 151b are included, defects of the pad pattern 144 may be reduced.

Figure 26:
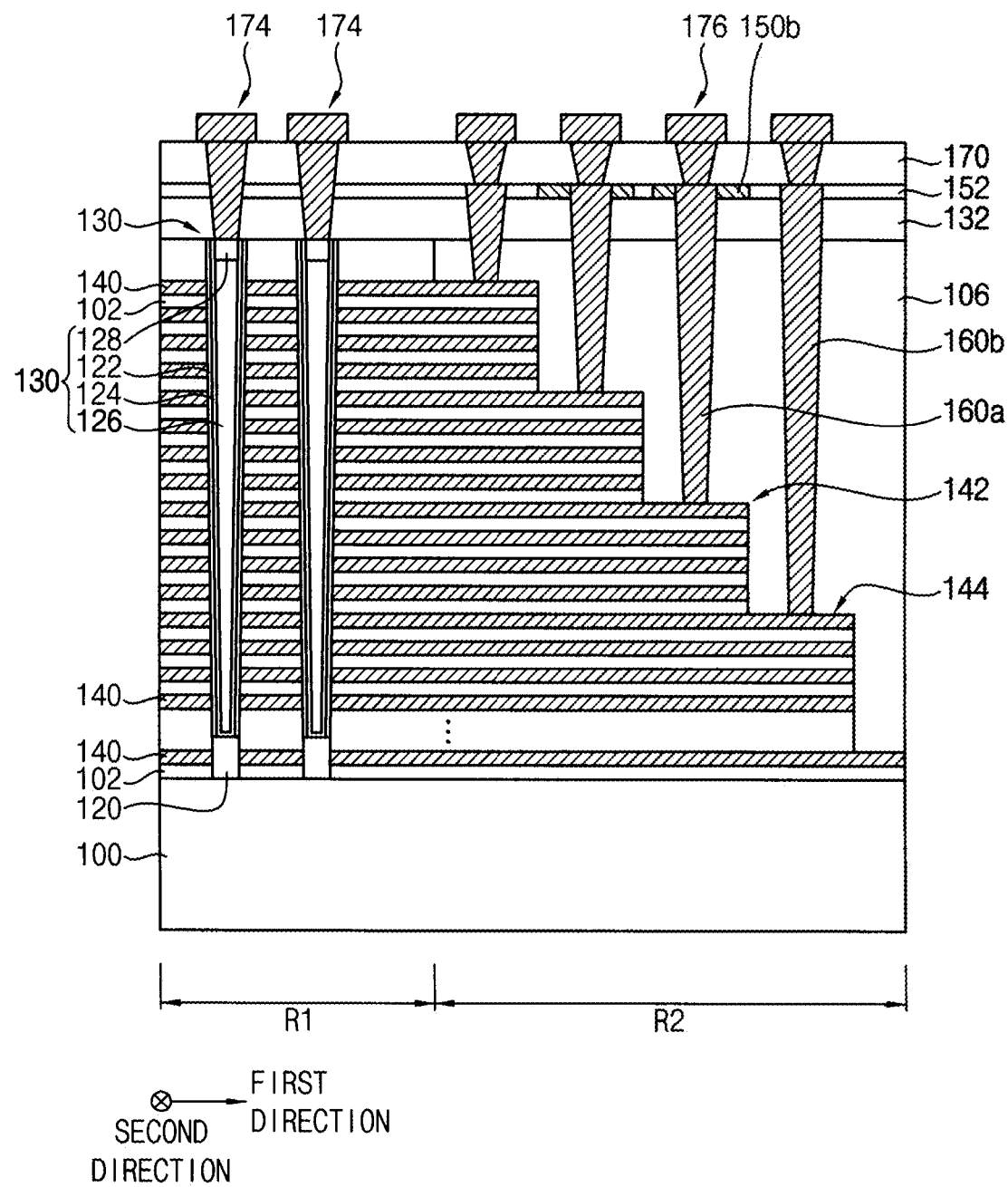
Figure 27:
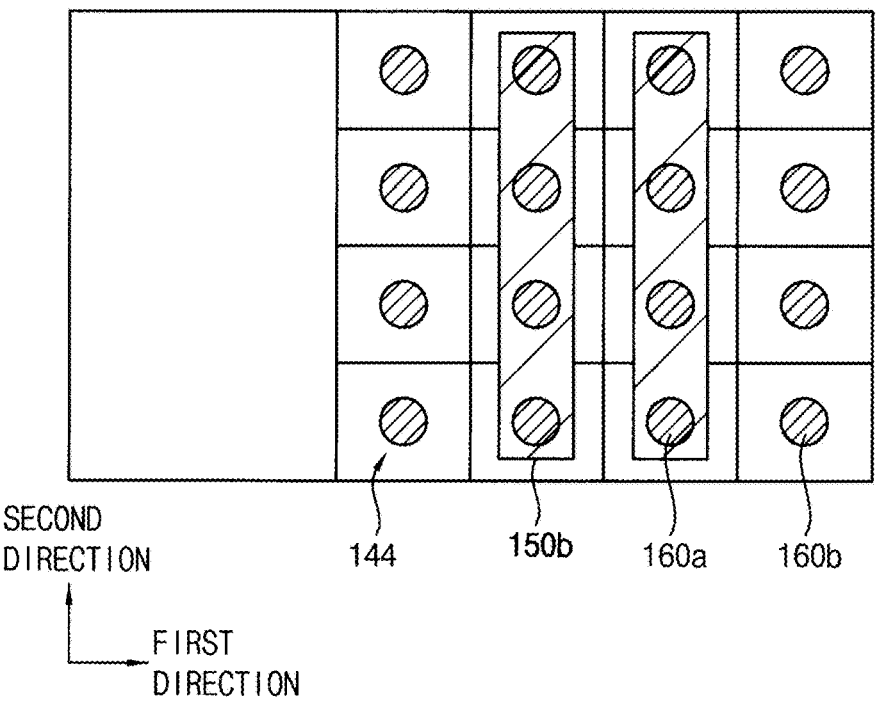
Figure 28:
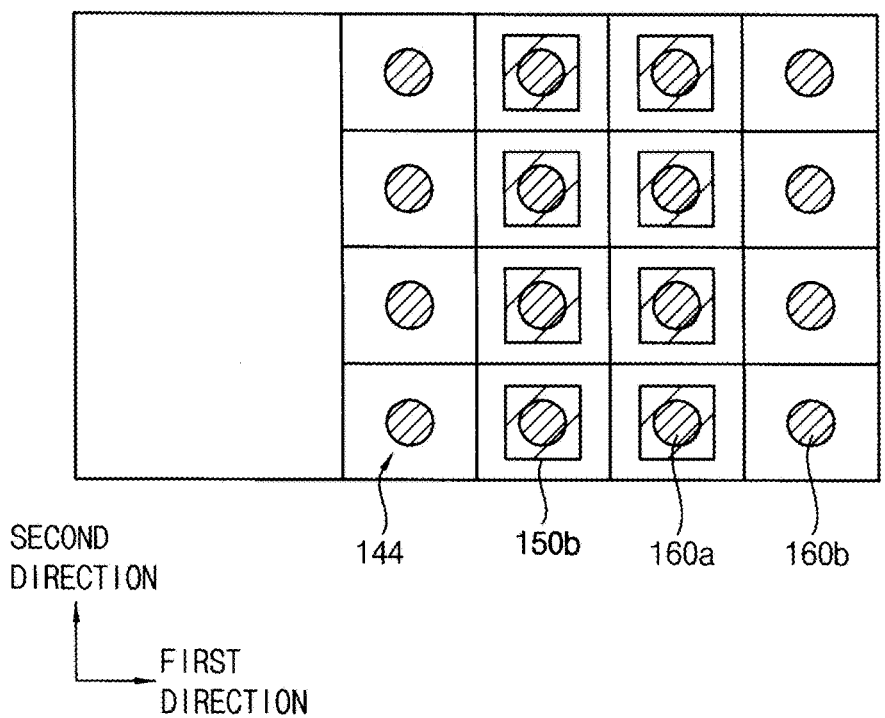

FIG. 26 is a cross-sectional view illustrating a vertical semiconductor device in accordance with example embodiments. FIG. 27 is a plan view illustrating a vertical semiconductor device in accordance with example embodiments. FIG. 28 is a plan view illustrating a vertical semiconductor device in accordance with example embodiments.

The vertical semiconductor device shown in FIG. 26 may be substantially the same as the vertical semiconductor device shown in FIG. 1, except that the buffer pattern includes isolated patterns.

Referring to FIG. 26, a plurality of buffer patterns 150b may be disposed on the pad structure 142. The buffer patterns 150b may be disposed over the pad patterns at each step in the first direction. The buffer patterns 150b may be disposed to be spaced apart from each other in the first direction.

In example embodiments, as shown in FIG. 27, the buffer pattern 150b may include isolated patterns, and buffer patterns 150b may be disposed over at each step in the second direction. That is, each of the buffer patterns 150b may extend in the second direction. Therefore, a plurality of first contact plugs 160a arranged in the second direction may pass through one of the buffer patterns 150b. In this case, the buffer patterns 150b may include an insulation material having a high etching selectivity with the silicon oxide.

In example embodiments, as shown in FIG. 28, the buffer pattern 150b may include isolated patterns, and each of the buffer patterns 150b may be formed over each of the pad patterns 144. That is, one of the first contact plugs 160a may pass through one of the buffer patterns 150b, respectively. In this case, the buffer patterns 150b may include an insulation material or a conductive material having a high etching selectivity with respect to the silicon oxide. For example, the buffer patterns may include silicon nitride, aluminum oxide, polysilicon, tungsten, tungsten nitride, or the like.

Figure 29:
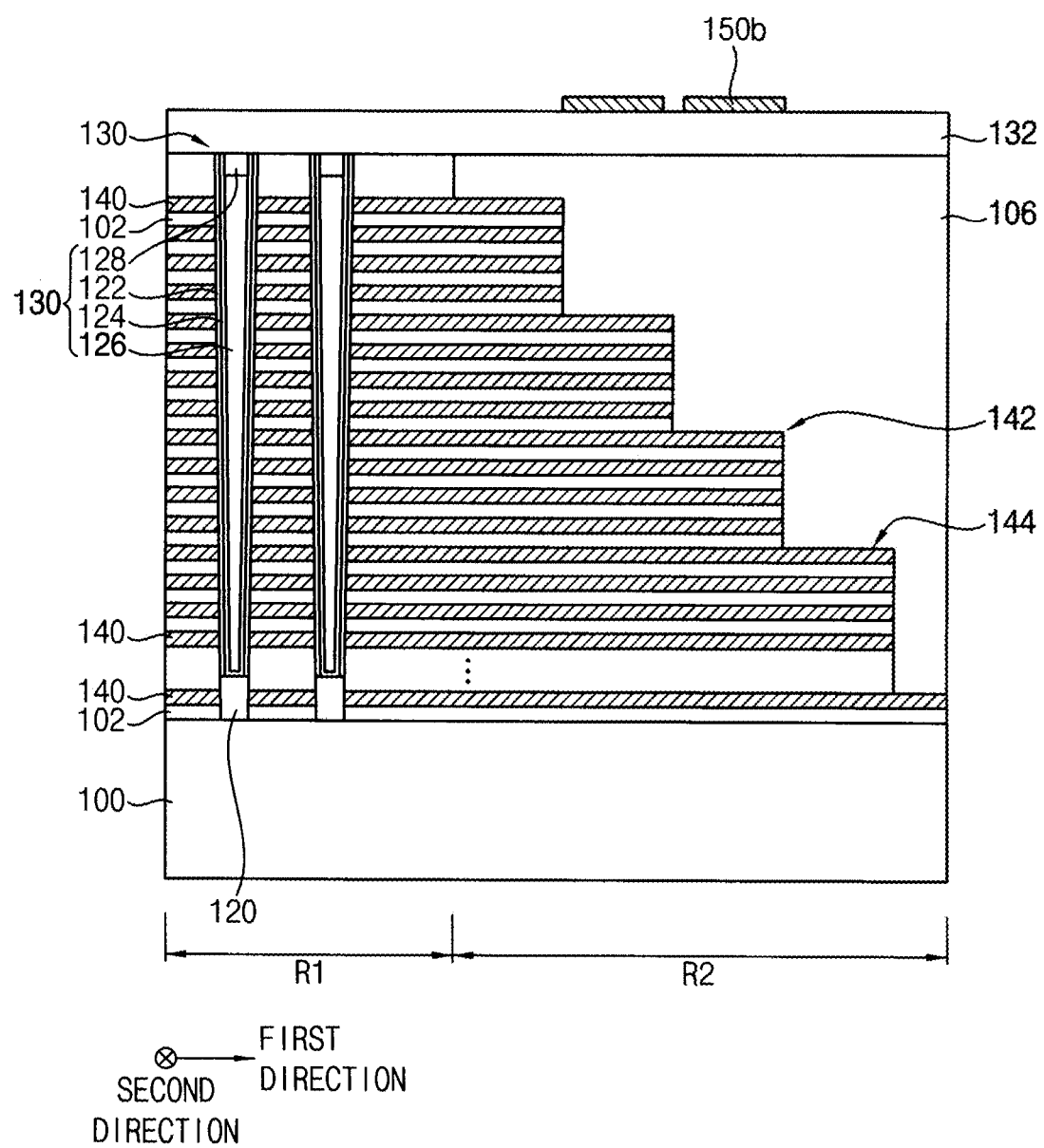
Figure 30:
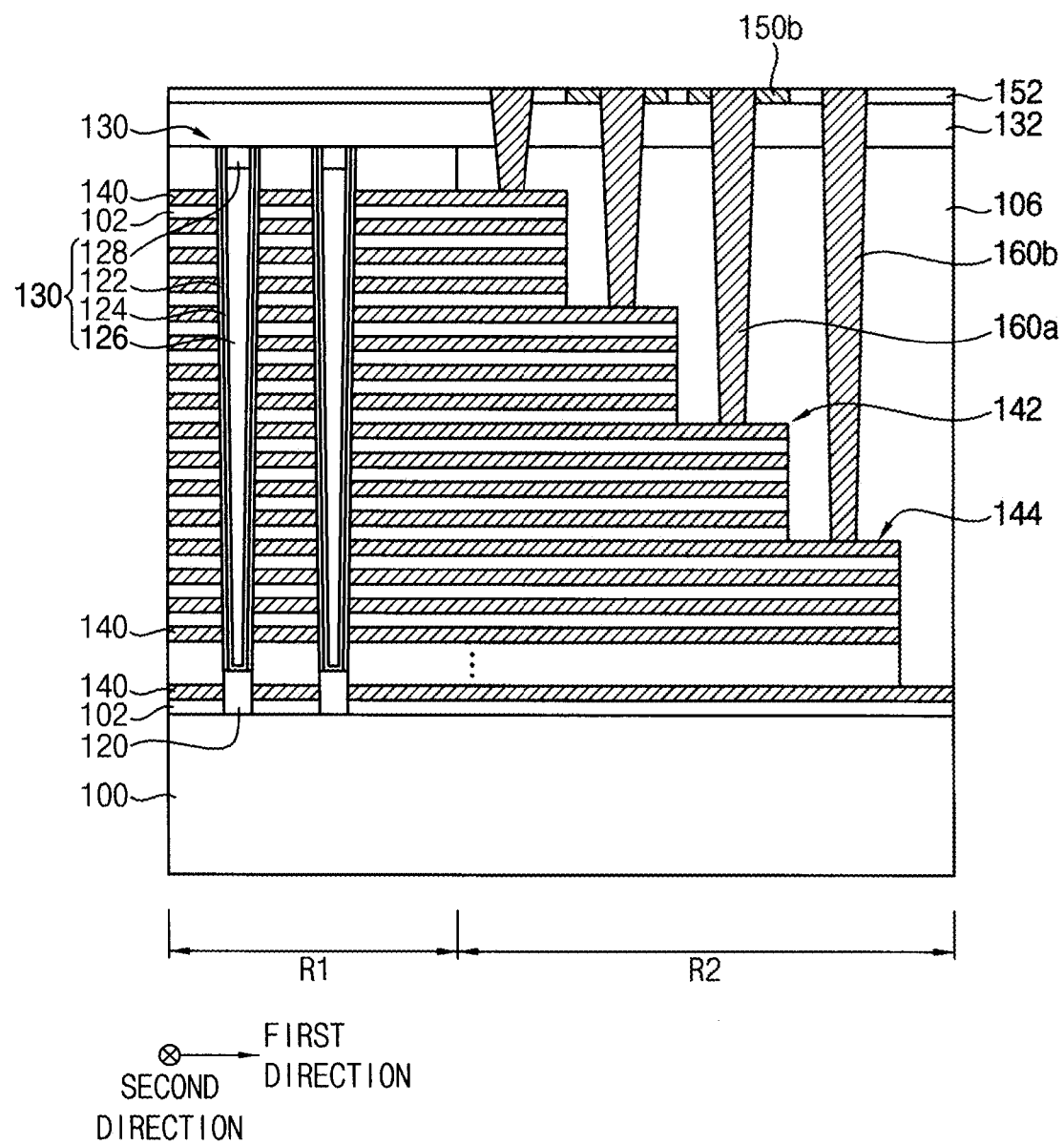

FIGS. 29 and 30 are cross-sectional views illustrating a method of manufacturing a vertical semiconductor device in accordance with example embodiments.

Referring to FIG. 29, first, the same process as illustrated with reference to FIGS. 4 to 8 may be performed. Then, the buffer layer may be formed on the second insulating interlayer 132, and the buffer layer may be patterned to form the buffer patterns 150b.

In example embodiments, the buffer pattern 150b may be formed over each step of the staircase of in the second direction to have a shape of an isolated pattern. In some example embodiments, the buffer pattern may be formed over each of the pad patterns 144 to have a shape of an isolated pattern. In this case, the pad patterns 144 may include an insulation material or a conductive material.

Referring to FIG. 30, the third insulating interlayer 152 may be formed to cover the buffer pattern 150*b*, and the third insulating interlayer 152 may be planarized until an upper surface of the buffer pattern 150*b* may be exposed.

Thereafter, the first and second contact plugs 160*a* and 160*b* may be formed through the third insulating interlayer 152, the second insulating interlayer 132, the buffer pattern 150*b* and the first insulating interlayer 106, so that each of the first and second contact plugs 160*a* and 160*b* may contact the pad pattern 144.

Referring to FIG. 26 again, subsequently, the fourth insulating interlayer 170, the bit line structure 174 and the upper wiring 176 may be formed on the third insulating interlayer 152. Therefore, the semiconductor device shown in FIG. 26 may be manufactured.

Figure 31:
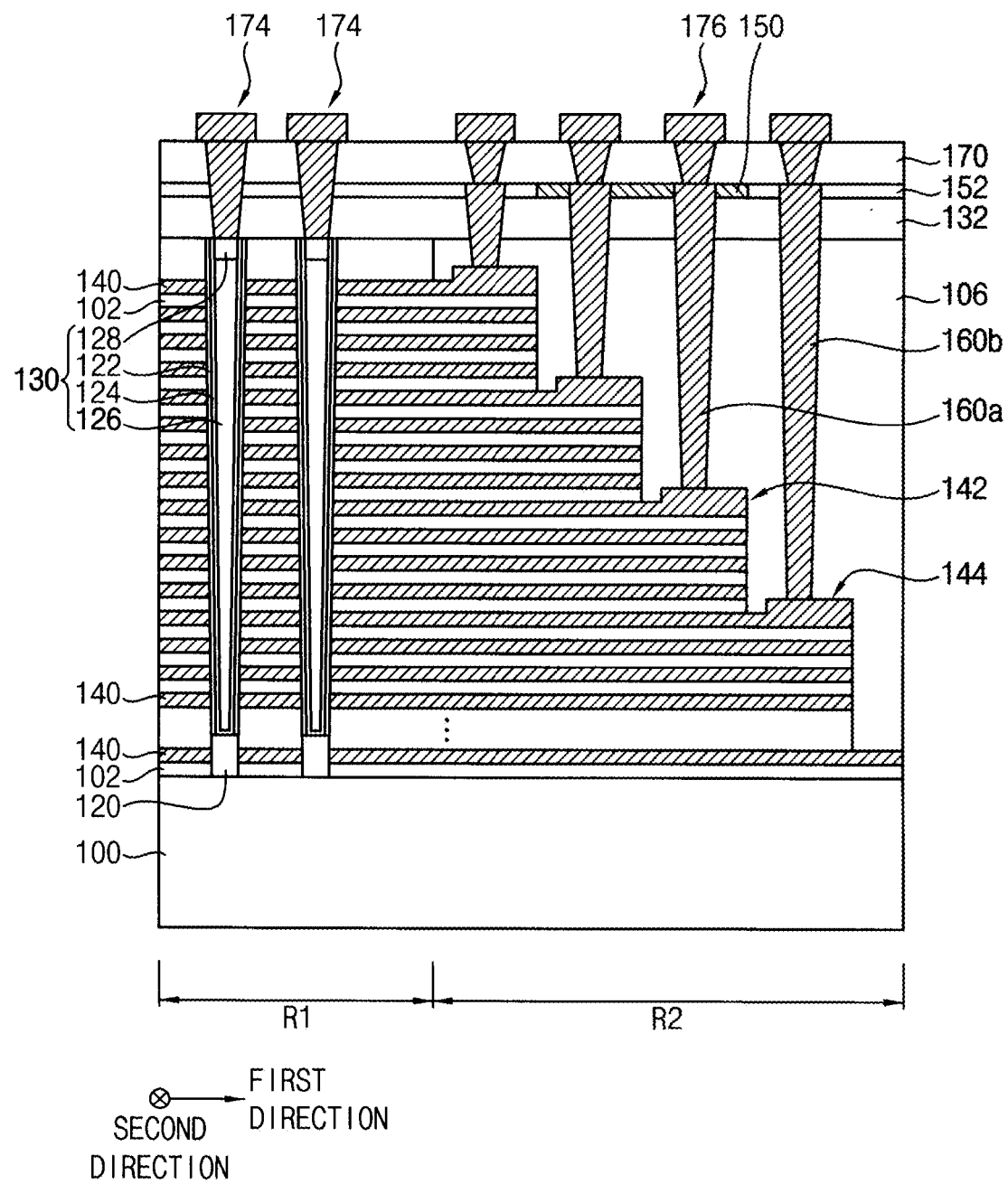

FIG. 31 is a cross-sectional view illustrating a vertical semiconductor device in accordance with example embodiments.

The vertical semiconductor device shown in FIG. 31 may be substantially the same as the vertical semiconductor device shown in FIG. 1, except that a thickness of the pad pattern is greater than a thickness of the conductive pattern in the first region.

Referring to FIG. 31, the conductive pattern included in the pad structure 142 may include an extension portion and an exposed portion, and the exposed portion of the conductive pattern may serve as the pad pattern 144.

In example embodiments, the extension portion and the pad pattern 144 may have different thicknesses. Particularly, the pad pattern 144 may have a thickness greater than that of the extension portion. Therefore, defects such as the punching may be reduced when the contact holes are formed on the pad pattern 144. The pad pattern 144 may be referred to as a raised pad pattern.

Further, a buffer pattern 150 may be formed over at least a portion of the pad pattern 144.

Although not shown, the raised pad pattern illustrated above may be applied to each of example embodiments. That is, the thickness of the pad pattern may be greater than the thickness of the conductive pattern beside of the pad pattern.

Figure 32:
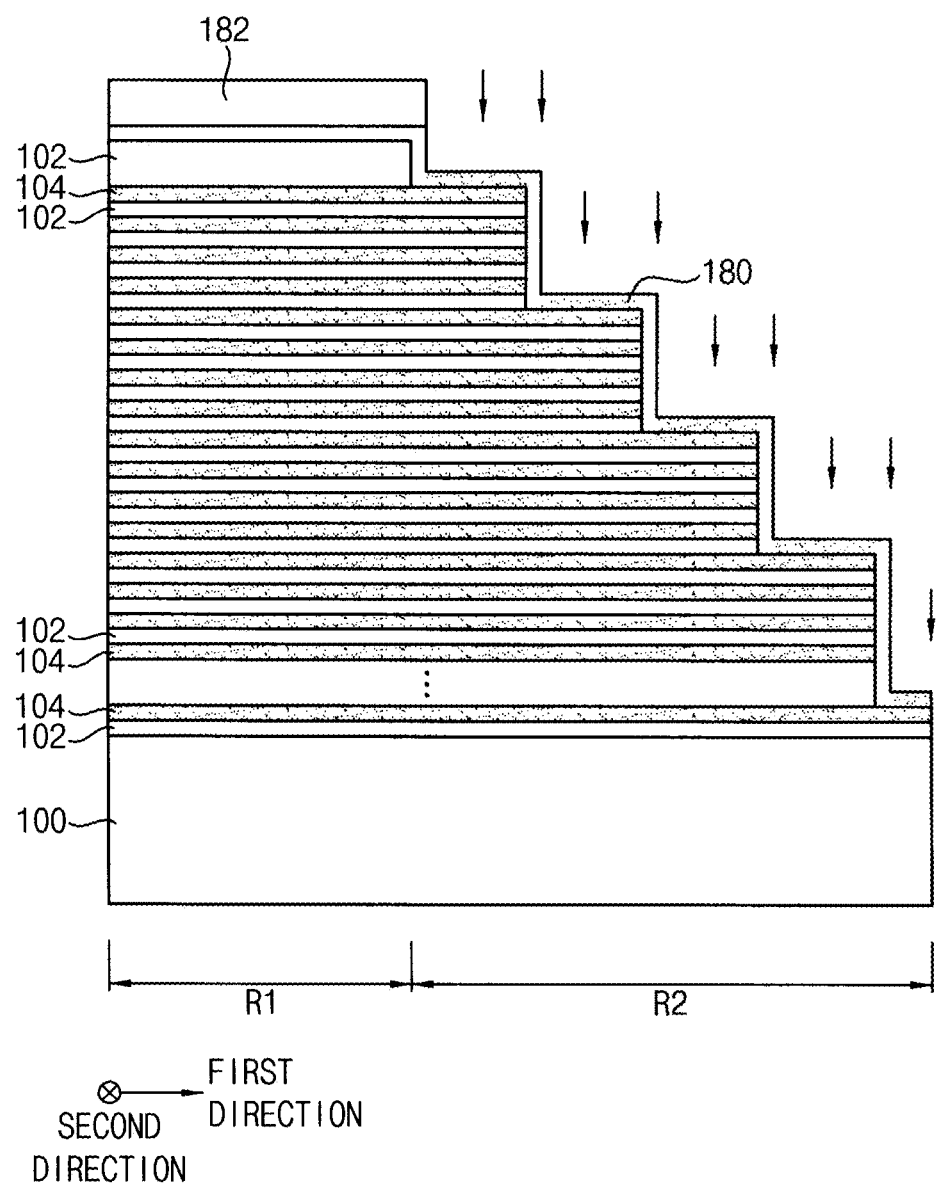
Figure 33:
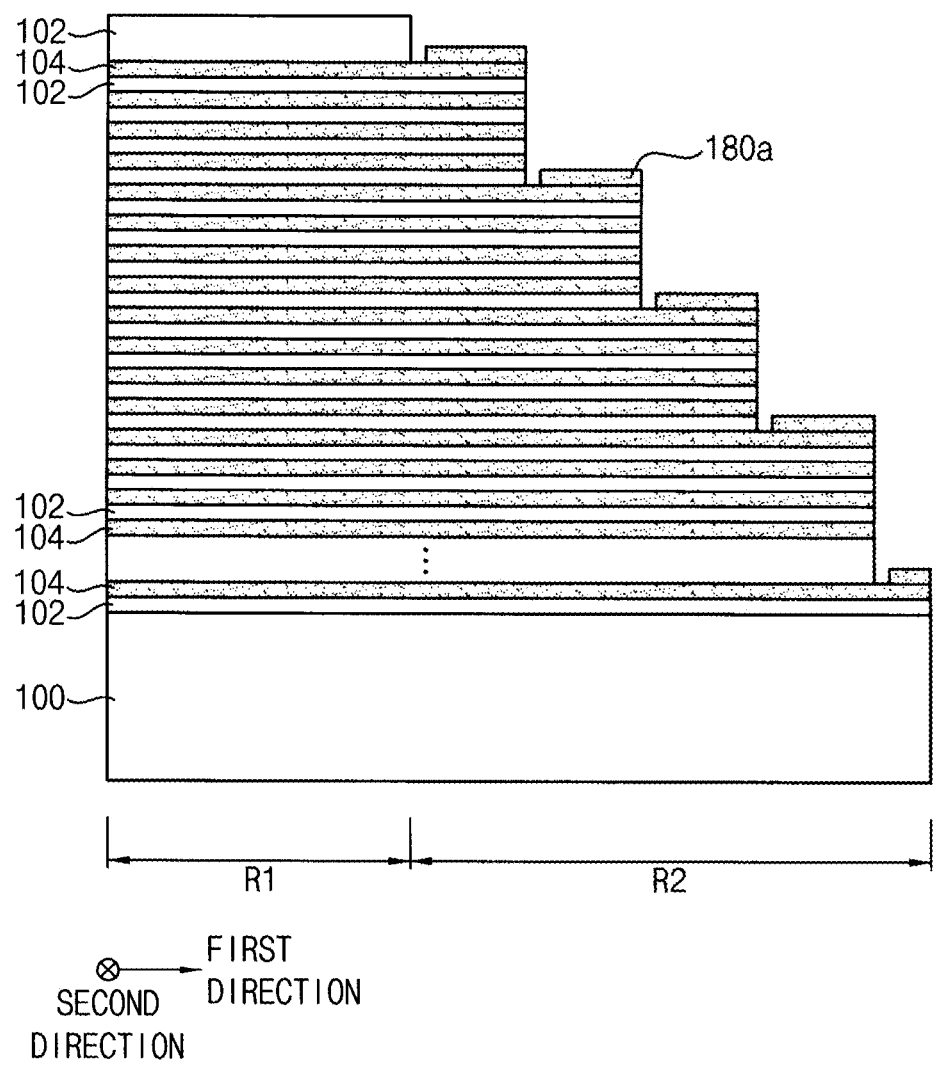

FIGS. 32 and 33 are cross-sectional views illustrating a method of manufacturing a vertical semiconductor device in accordance with example embodiments.

First, the processes illustrated with reference to FIGS. 4 and 5 may be performed to form the step mold structure 108*a* on the substrate 100 of the first and second regions R1 and R2.

Referring to FIG. 32, a second sacrificial layer 180 is conformally formed on a surface of the step mold structure. In example embodiments, the second sacrificial layer 180 may include silicon nitride.

A mask pattern 182 may be formed to cover the step mold structure formed on the substrate of the first region. Thereafter, a plasma surface treatment process may be performed on an upper surface of the second sacrificial layer 180. The upper surface of the second sacrificial layer 180 may be damaged by the plasma surface treatment process.

When the plasma surface treatment process is performed, the plasma may be supplied in a vertical straight direction from the substrate 100. Thus, plasma damages may hardly occur at the second sacrificial layer 180 formed on sidewalls of the staircase. On the other hand, the plasma damages may occur at a flat upper surface of the second sacrificial layer 180.

That is, the second sacrificial layer 180 of a plasma-treated portion may have a high density and a high concentration of impurities, so that the second sacrificial layer 180 of a plasma-treated portion may have a low etching rate. On the other hand, the second sacrificial layer 180 of the non-plasma treated portion formed on the sidewalls of the staircase may have an etching rate higher than an etching rate of the second sacrificial layer 180 of a plasma-treated portion.

Referring to FIG. 33, the second sacrificial layer 180 formed on the sidewalls of the staircase may be selectively removed. The remove process may include a wet etching process.

As the second sacrificial layer 180 formed on the sidewalls of staircase has relatively high etching rate, the second sacrificial layer 180 may be rapidly etched in the etching process. However, the second sacrificial layer 180 of the plasma-treated portion may hardly be etched. Therefore, a second sacrificial layer pattern 180*a* may be formed on the sacrificial layer pattern 104 on an upper surface of each step of the staircase.

Thereafter, the same process as illustrated with reference to FIGS. 6 to 18 may be performed to form the vertical semiconductor device illustrated in FIG. 29. However, when the gaps are formed by the process illustrated with reference to FIG. 7, the sacrificial layer patterns 104 and the second sacrificial layer pattern 180*a* may be etched together. Therefore, a height of the gap for forming the pad pattern may be greater than a height of the gap for forming conductive pattern beside of the pad pattern. Therefore, when the first conductive pattern is formed by the processes illustrated with reference to FIG. 8, the pad pattern 144 may be formed greater than the conductive pattern beside of the pad pattern as shown in FIG. 31.

The vertical semiconductor devices in accordance with example embodiments may reduce the defect of the contact plug. The vertical semiconductor device may be used in various electronic products.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical semiconductor device, comprising:
   a substrate;
   a stacked structure on the substrate, the stacked structure including insulation patterns and conductive patterns stacked on each other on the substrate, the conductive patterns extending in a first direction parallel to an upper surface of the substrate,
   edges of the conductive patterns having a staircase shape, the conductive patterns including pad patterns that are defined by exposed portions of upper surfaces of the conductive patterns;
an insulating interlayer covering the stacked structure;
a buffer pattern on the insulating interlayer;
a first contact plug passing through the buffer pattern and the insulating interlayer, the first contact plug contacting one of the pad patterns; and
a second contact plug passing through the insulating interlayer and not passing through the buffer pattern.

2. The vertical semiconductor device of claim 1, wherein the buffer pattern includes a material having an etch selectivity with respect to the insulating interlayer.

3. The vertical semiconductor device of claim 1, wherein the insulating interlayer includes silicon oxide, and
the buffer pattern includes a material having an etching rate lower than an etching rate of the silicon oxide, in an etching process.

4. The vertical semiconductor device of claim 1, wherein the buffer pattern faces at least one of the pad patterns.

5. The vertical semiconductor device of claim 1, wherein the buffer pattern has a uniform thickness.

6. The vertical semiconductor device of claim 1, wherein
a first portion of the buffer pattern has a first thickness,
a second portion of the buffer pattern has a second thickness that is less the first thickness,
the first portion of the buffer pattern faces the pad patterns positioned between an uppermost step and a lowermost step in a portion of the staircase shape of the edges of the conductive patterns, and
the second portion of the buffer pattern faces the pad patterns positioned at the uppermost step and the lowermost step in the portion of the staircase shape of the edges of the conductive patterns.

7. The vertical semiconductor device of claim 1,
wherein the second contact plug contacts an upper surface of a corresponding one of the pad patterns.

8. The vertical semiconductor device of claim 7, wherein the buffer pattern faces the pad patterns positioned between an uppermost step and a lowermost step a portion of the staircase shape, of the edges of the conductive patterns, that is below the first contact plug and the second contact plug.

9. The vertical semiconductor device of claim 1, further comprising:
a plurality of first contact plugs, wherein
the plurality of first contact plugs include the first contact plug,
the plurality of first contact plugs pass through the buffer pattern, and
the buffer pattern is one pattern.

10. The vertical semiconductor device of claim 1, wherein the buffer pattern includes an insulation material.

11. The vertical semiconductor device of claim 10, wherein the buffer pattern includes silicon oxide or aluminum oxide.

12. The vertical semiconductor device of claim 1, further comprising:
a channel structure passing through the stacked structure and extending in a vertical direction perpendicular to the upper surface of the substrate.

13. A vertical semiconductor device, comprising:
a substrate;
a stacked structure on the substrate,
the stacked structure including insulation patterns and conductive patterns stacked on each other on the substrate,
the conductive patterns extending in a first direction parallel to an upper surface of the substrate,
edges of the conductive patterns having a staircase shape, and
the conductive patterns including pad patterns that are defined by exposed portions of upper surfaces of the conductive patterns;
a channel structure passing through the stacked structure and extending in a vertical direction;
an insulating interlayer covering the stacked structure;
a buffer pattern on the insulating interlayer, the buffer pattern facing at least one of the pad patterns;
a first contact plug passing through the buffer pattern and the insulating interlayer, the first contact plug contacting one of the pad patterns;
a second contact plug passing through only the insulating interlayer, the second contact plug contacting one of the pad patterns; and
upper wirings electrically connected to the first contact plug and the second contact plug, respectively.

14. The vertical semiconductor device of claim 13, wherein
the insulating interlayer includes silicon oxide, and
the buffer pattern includes a material having an etching rate lower than an etching rate of the silicon oxide, in an etching process.

15. The vertical semiconductor device of claim 13, wherein the buffer pattern has a uniform thickness for each position or a different thickness for each position.

16. The vertical semiconductor device of claim 13, further comprising:
a plurality of first contact plugs, wherein
the plurality of first contact plugs include the first contact plug, and
the plurality of first contact plugs pass through the buffer pattern, where the buffer pattern is one pattern.

17. A vertical semiconductor device, comprising:
a substrate;
a stacked structure on the substrate,
the stacked structure including insulation patterns and conductive patterns stacked on each other on the substrate,
the conductive patterns extending in a first direction parallel to an upper surface of the substrate,
edges of the conductive patterns having a staircase shape,
the conductive patterns including pad patterns that are defined by exposed portions of upper surface of the conductive patterns;
an insulating interlayer covering the stacked structure;
a plurality of buffer patterns on the insulating interlayer and spaced apart from each other, the plurality of buffer patterns including a buffer pattern, the buffer pattern including a material having an etch selectivity with respect to the insulating interlayer; and
a first contact plug passing through the buffer pattern and the insulating interlayer, the first contact plug contacting one of the pad patterns.

18. The vertical semiconductor device of claim 17, further comprising:
a plurality of first contact plugs, wherein
the plurality of first contact plugs include the first contact plug, and
one of the plurality of first contact plugs passes through one of the plurality of buffer patterns, respectively.

19. The vertical semiconductor device of claim 18, wherein the plurality of buffer patterns include an insulation material or a conductive material.

20. The vertical semiconductor device of claim 17, wherein
the plurality of the buffer patterns are spaced apart from each other in a vertical direction perpendicular to the upper surface of the substrate.

* * * * *